United States Patent
Chen et al.

(10) Patent No.: US 11,705,343 B2
(45) Date of Patent: Jul. 18, 2023

(54) INTEGRATED CIRCUIT PACKAGE AND METHOD OF FORMING THEREOF

(71) Applicant: Taiwan Semiconductor Manufacturing Co., Ltd., Hsinchu (TW)

(72) Inventors: Hsien-Wei Chen, Hsinchu (TW); Ming-Fa Chen, Taichung (TW); Ying-Ju Chen, Tuku Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/328,001

(22) Filed: May 24, 2021

(65) Prior Publication Data
US 2022/0301890 A1 Sep. 22, 2022

Related U.S. Application Data

(60) Provisional application No. 63/162,629, filed on Mar. 18, 2021.

(51) Int. Cl.
*H01L 21/56* (2006.01)
*H01L 21/78* (2006.01)
(Continued)

(52) U.S. Cl.
CPC ............ *H01L 21/563* (2013.01); *H01L 21/78* (2013.01); *H01L 23/31* (2013.01); *H01L 23/5384* (2013.01); *H01L 23/5386* (2013.01)

(58) Field of Classification Search
CPC ....... H01L 21/563; H01L 21/78; H01L 23/31; H01L 23/5384; H01L 23/5386; H01L 23/49816; H01L 23/49833; H01L 24/08; H01L 24/16; H01L 24/81; H01L 24/92; H01L 2224/0401; H01L 2224/08121; H01L 2224/08225; H01L 2224/09181; H01L 2224/13022; H01L 2224/13023; H01L 2224/13562; H01L 2224/16058; H01L 2224/16238; H01L 2224/73204; H01L 2224/73251; H01L 2224/8003;
(Continued)

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

TW 202042097 A 11/2020

*Primary Examiner* — Thanh T Nguyen
(74) *Attorney, Agent, or Firm* — Slater Matsil, LLP

(57) ABSTRACT

A method of forming an integrated circuit package includes attaching a first die to an interposer. The interposer includes a first die connector and a second die connector on the interposer and a first dielectric layer covering at least one sidewall of the first die connector and at least one sidewall of the second die connector. The first die is coupled to the first die connector and to the first dielectric layer and the second die connector is exposed by the first die. The method further includes recessing the first dielectric layer to expose at least one sidewall of the second die connector and attaching a second die to the interposer, the second die being coupled to the second die connector.

20 Claims, 33 Drawing Sheets

(51) Int. Cl.
*H01L 23/31* (2006.01)
*H01L 23/538* (2006.01)

(58) Field of Classification Search
CPC . H01L 2224/80097; H01L 2224/80099; H01L 2224/80201; H01L 2224/80357; H01L 2224/80801; H01L 2224/80895; H01L 2224/80896; H01L 2224/80906; H01L 2224/80948; H01L 2224/81193; H01L 2224/81815; H01L 2224/9222; H01L 2224/94; H01L 21/4853; H01L 23/49811; H01L 23/5383; H01L 2221/68327; H01L 2221/68354; H01L 21/561; H01L 21/6835; H01L 23/3135; H01L 25/03; H01L 2224/8093; H01L 25/0657; H01L 24/80; H01L 21/60; H01L 25/18; H01L 25/50; H01L 2224/08145; H01L 2224/16145; H01L 2225/06541; H01L 2225/06565; H01L 23/3128; H01L 23/3142; H01L 24/73; H01L 2224/73209
See application file for complete search history.

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2014/0264769 A1 | 9/2014 | Chen et al. |
| 2019/0067244 A1 | 2/2019 | Chen et al. |
| 2019/0341319 A1 | 11/2019 | Chen et al. |
| 2020/0144224 A1 | 5/2020 | Lin et al. |
| 2020/0161242 A1* | 5/2020 | Lin ............... H01L 25/0652 |
| 2020/0312760 A1 | 10/2020 | Park et al. |
| 2021/0043557 A1* | 2/2021 | Lee ............... H01L 23/481 |
| 2021/0193637 A1* | 6/2021 | Jeng ............... H01L 23/5384 |
| 2022/0384326 A1* | 12/2022 | Yang ............... H01L 24/20 |

* cited by examiner

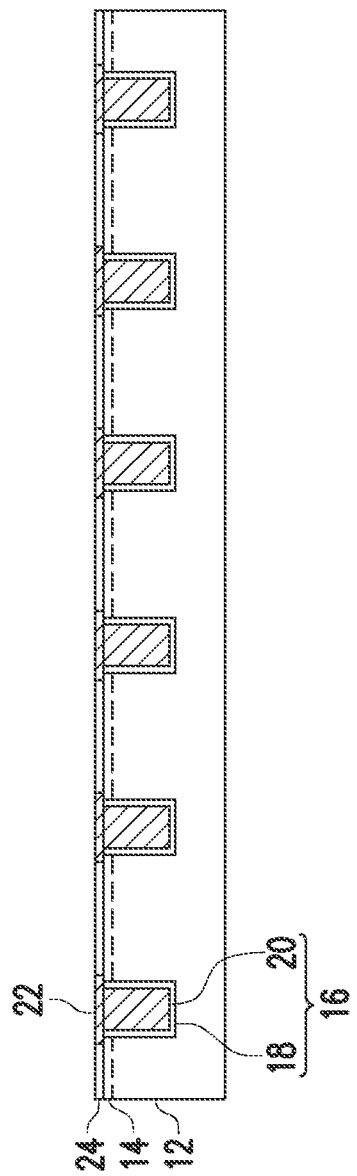

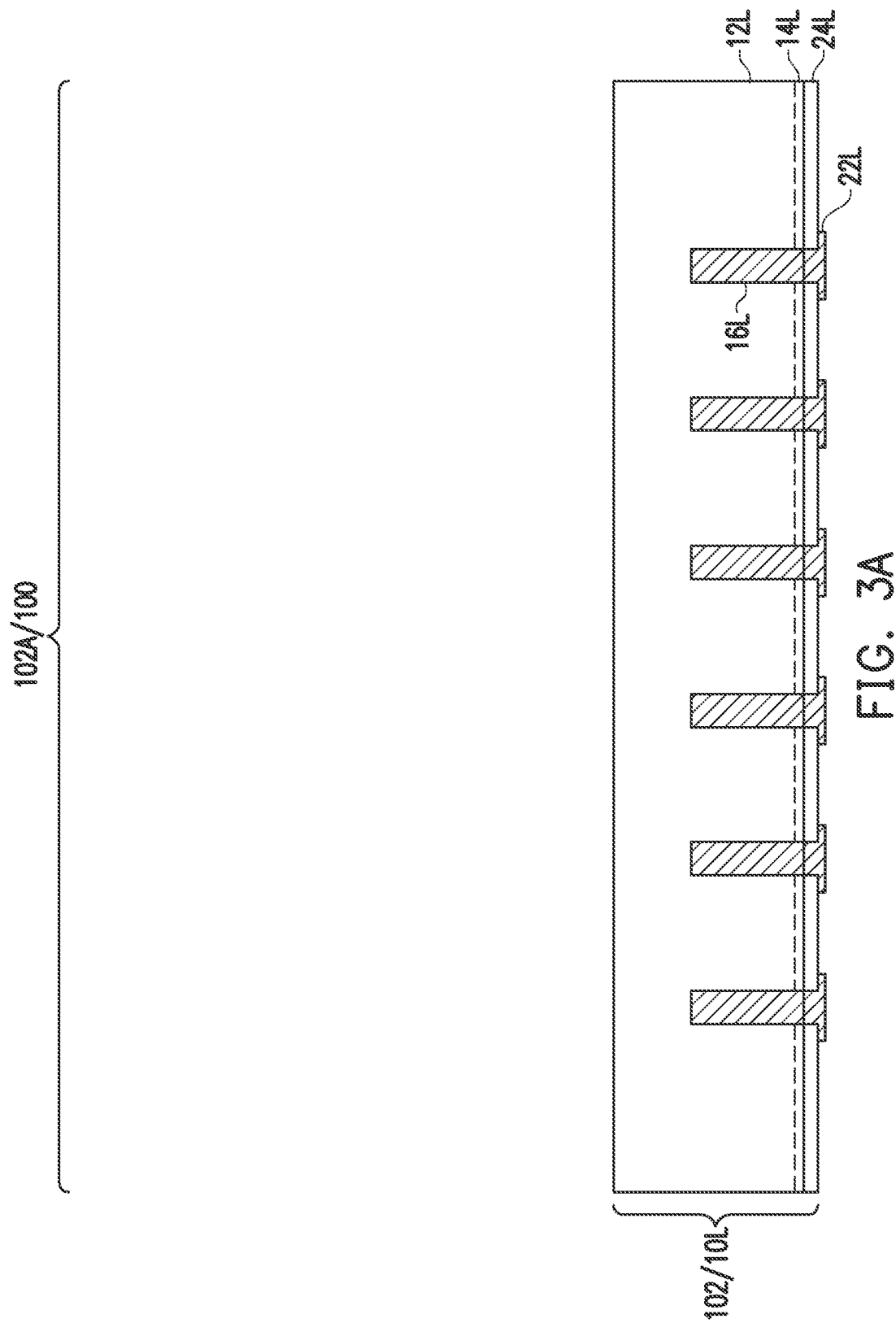

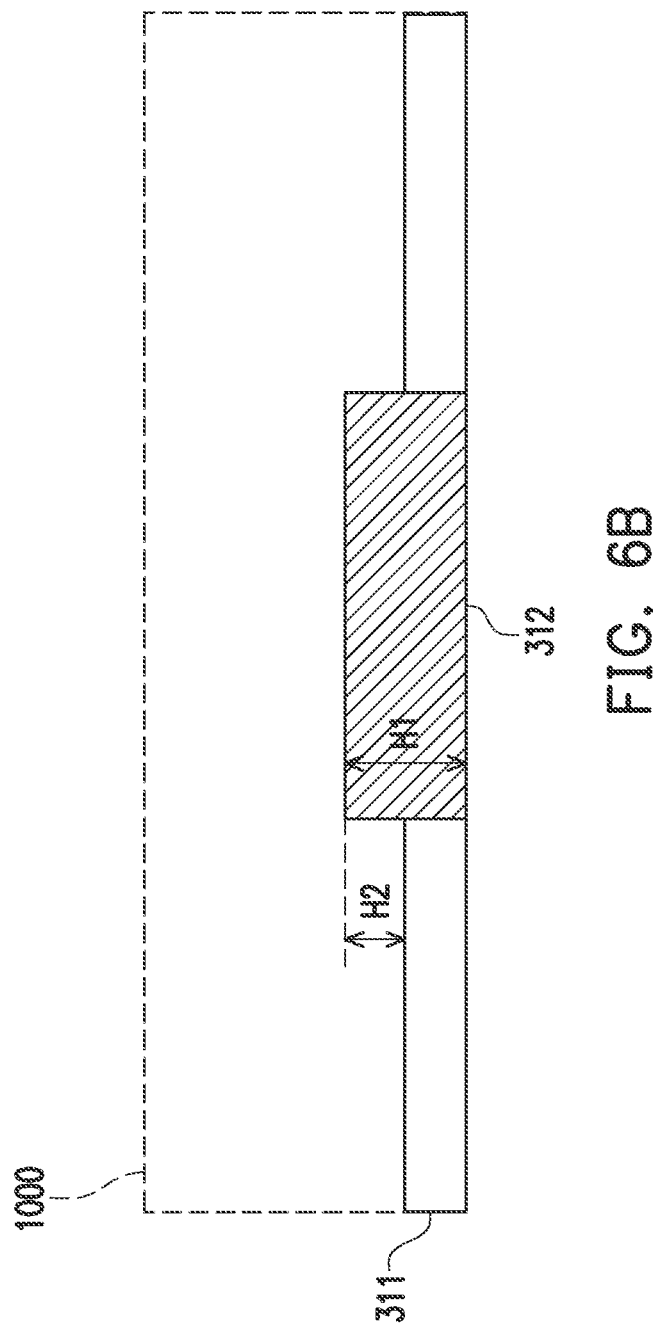

INTEGRATED CIRCUIT PACKAGE AND METHOD OF FORMING THEREOF

PRIORITY CLAIM AND CROSS-REFERENCE

This application claims the benefit of U.S. Provisional Application No. 63/162,629, filed on Mar. 18, 2021, which application is hereby incorporated herein by reference.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are two-dimensional in nature, in that the area occupied by the integrated components is on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional package that includes multiple chips. Other packages have also been developed to incorporate three-dimensional aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a cross-sectional view of an integrated circuit device, in accordance with some embodiments.

FIGS. 3A through 3D are cross-sectional views of intermediate steps during a process for forming a HBM device, in accordance with some embodiments.

DETAILED DESCRIPTION

Figure 2A:
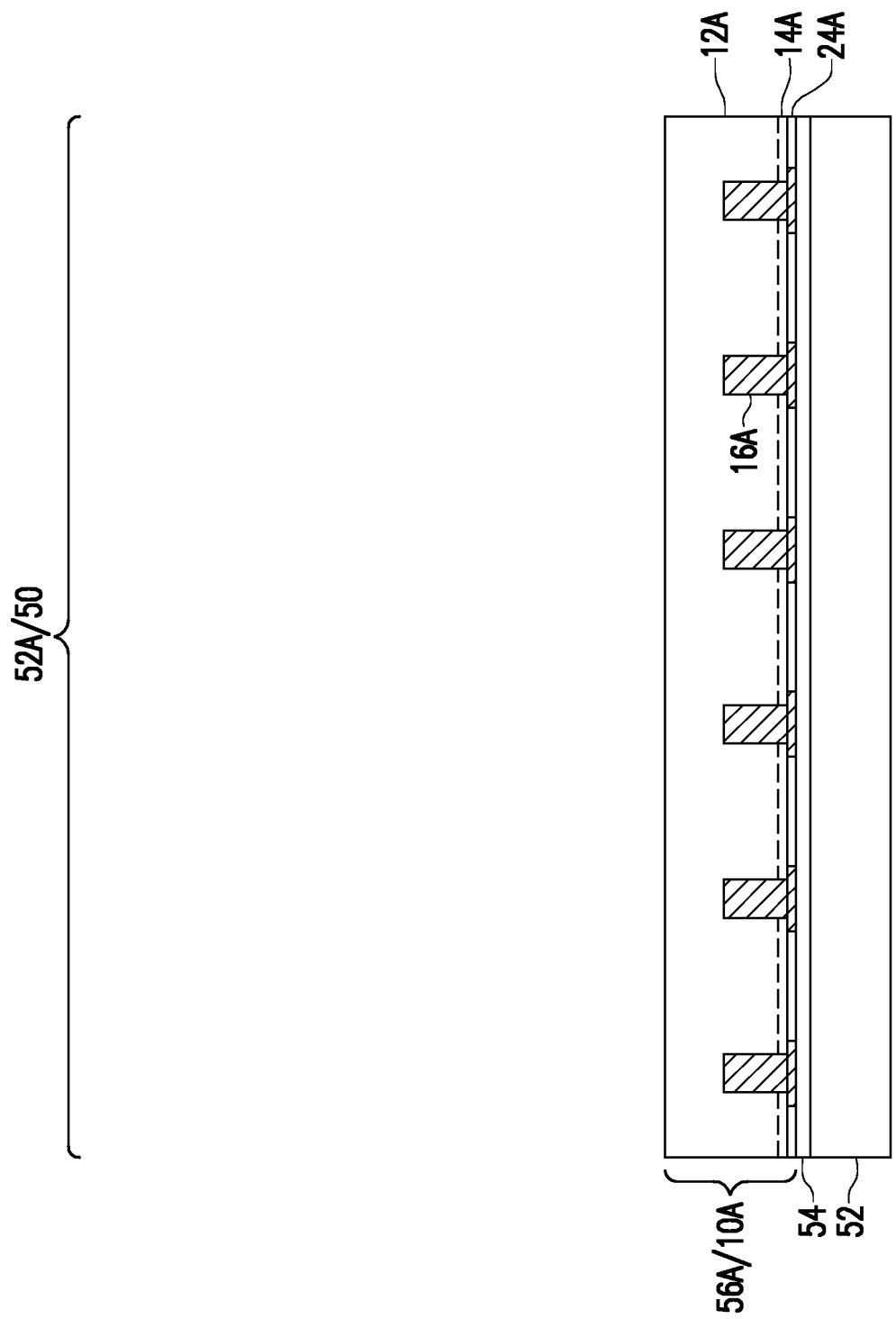
FIGS. 2A through 2F are cross-sectional views of intermediate steps during a process for forming a memory cube, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, two devices such as e.g. a logic die and a memory device are bonded to an interposer. After bonding the logic die to bonding pads in a dielectric layer on the interposer, the remaining exposed portion of the dielectric layer is recessed to expose a larger proportion of the surface areas of bonding pads extending from the recessed dielectric layer. This provides a larger bonding area for a memory device subsequently bonded to the interposer using e.g. flip chip bonding, enhancing the bonding strength, and increases a gap between the interposer and the memory device. This increased gap provides a larger process window for underfill filling between the memory device and the interposer, increasing the reliability of the bonding. A cap layer such as, e.g., an electroless nickel/electroless palladium (ENEP) layer may be formed over the exposed surface area of the bonding pads, which may reduce the amount of intermetallic compound (IMC) formed in solder joints between the memory device and the interposer.

FIG. 1 is a cross-sectional view of an integrated circuit device 10, in accordance with some embodiments. The integrated circuit device 10 may be a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or a combination thereof. The integrated circuit device 10 is formed in a wafer (not shown), which includes different device regions. In some embodiments, multiple wafers will be stacked to form a wafer stack, which is singulated in subsequent processing to form multiple die stacks. In some embodiments, a wafer is singulated to form a plurality of integrated circuit devices 10, which are stacked in subsequent processing to form multiple die stacks. The integrated circuit device 10 may be processed according to applicable manufacturing processes to form integrated circuits. For example, the integrated circuit device 10 may include a semiconductor substrate 12, an interconnect structure 14, conductive vias 16, die connectors 22, and a dielectric layer 24.

The semiconductor substrate 12 may be silicon, doped or undoped, or an active layer of a semiconductor-on-insulator (SOI) substrate. The semiconductor substrate 12 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 12 has an active surface (e.g., the surface facing upwards in FIG. 1), sometimes called a front side, and an inactive surface (e.g., the surface facing downwards in FIG. 1), sometimes called a back side.

Devices may be formed at the active surface of the semiconductor substrate 12. The devices may be active devices (e.g., transistors, diodes, etc.), capacitors, resistors, etc. The inactive surface may be free from devices. An inter-layer dielectric (ILD) is over the active surface of the semiconductor substrate 12. The ILD surrounds and may cover the devices. The ILD may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

The interconnect structure 14 is over the active surface of the semiconductor substrate 12. The interconnect structure 14 interconnects the devices at the active surface of the semiconductor substrate 12 to form an integrated circuit. The interconnect structure 14 may be formed by, for example, metallization patterns in dielectric layers. The metallization patterns include metal lines and vias formed in one or more dielectric layers. The metallization patterns of the interconnect structure 14 are electrically coupled to the devices at the active surface of the semiconductor substrate 12.

The conductive vias 16 are formed extending into the interconnect structure 14 and/or the semiconductor substrate 12. The conductive vias 16 are electrically coupled to metallization patterns of the interconnect structure 14. As an example to form the conductive vias 16, recesses can be formed in the interconnect structure 14 and/or the semiconductor substrate 12 by, for example, etching, milling, laser techniques, a combination thereof, and/or the like. A thin dielectric material may be formed in the recesses, such as by using an oxidation technique. A barrier layer 18 may be conformally deposited in the recesses, such as by CVD, atomic layer deposition (ALD), physical vapor deposition (PVD), thermal oxidation, a combination thereof, and/or the like. The barrier layer 18 may be formed from an oxide, a nitride, or an oxynitride, such as titanium nitride, titanium oxynitride, tantalum nitride, tantalum oxynitride, tungsten nitride, a combination thereof, and/or the like. A conductive material 20 may be deposited over the barrier layer 18 and in the recesses. The conductive material 20 may be formed by an electro-chemical plating process, CVD, PVD, a combination thereof, and/or the like. Examples of conductive materials are copper, tungsten, aluminum, silver, gold, a combination thereof, and/or the like. Excess of the conductive material 20 and the barrier layer 18 is removed from the surface of the interconnect structure 14 and/or the semiconductor substrate 12 by, for example, a chemical-mechanical polish (CMP). Remaining portions of the barrier layer 18 and the conductive material 20 form the conductive vias 16.

In the embodiment illustrated, the conductive vias 16 are not yet exposed at the back side of the integrated circuit device 10. Rather, the conductive vias 16 are buried in the semiconductor substrate 12. As will be discussed in greater detail below, the conductive vias 16 will be exposed at the back side of the integrated circuit device 10 in subsequent processing. After exposure, the conductive vias 16 can be referred to as through-silicon vias or through-substrate vias (TSVs).

The die connectors 22 are at a front side of the integrated circuit device 10. The die connectors 22 may be conductive pillars, pads, or the like, to which external connections are made. The die connectors 22 are in and/or on the interconnect structure 14. The die connectors 22 can be formed of a metal, such as copper, titanium, aluminum, the like, or a combination thereof, and can be formed by, for example, plating, or the like.

The dielectric layer 24 is at the front side of the integrated circuit device 10. The dielectric layer 24 is in and/or on the interconnect structure 14. The dielectric layer 24 laterally encapsulates the die connectors 22, and the dielectric layer 24 is laterally coterminous (within process variations) with sidewalls of the integrated circuit device 10. The dielectric layer 24 may be an oxide such as silicon oxide, PSG, BSG, BPSG, or the like; a nitride such as silicon nitride or the like; a polymer such as polybenzoxazole (PBO), polyimide, a benzocyclobutene (BCB) based polymer, or the like; or a combination thereof. The dielectric layer 24 may be formed, for example, by spin coating, lamination, chemical vapor deposition (CVD), or the like. In some embodiments, the dielectric layer 24 is formed after the die connectors 22, and may bury the die connectors 22 such that the top surface of the dielectric layer 24 is above the top surfaces of the die connectors 22. In some embodiments, the die connectors 22 are formed after the dielectric layer 24, such as by a damascene process, e.g., single damascene, dual damascene, or the like. After formation, the die connectors 22 and the dielectric layer 24 can be planarized using, e.g., a CMP process, an etch back process, the like, or combinations thereof. After planarization, the top surfaces of the die connectors 22 and dielectric layer 24 are coplanar (within process variations) and are exposed at the front side of the integrated circuit device 10. In another embodiment, the die connectors 22 are formed after the dielectric layer 24, such as by a plating process, and are raised connectors (e.g., microbumps) such that the top surfaces of the die connectors 22 extend above the top surface of the dielectric layer 24.

FIGS. 2A through 2F are cross-sectional views of intermediate steps during a process for forming a memory cube 50, in accordance with some embodiments. As will be discussed in greater detail below, FIGS. 2A through 2F illustrate a process in which a memory cube 50 is formed by stacking multiple wafers that include first integrated circuit devices on a carrier substrate 52. The first integrated circuit devices may each have a structure similar to the integrated circuit device 10 discussed above with reference to FIG. 1, and in an embodiment may be memory devices. Stacking of wafers to form a memory cube 50 in one device region 52A of the carrier substrate 52 is illustrated, but it should be appreciated that the carrier substrate 52 may have any number of device regions, and a memory cube 50 may be formed in each device region. The memory cube 50 is formed in a top-down (or reverse) manner by wafer-on-wafer (WoW) stacking, where a wafer for the top layer of the memory cube 50 is provided, and wafers for underlying layers of the memory cube 50 are subsequently stacked on the top wafer. The wafer stack is singulated to form multiple memory cubes 50. The memory cubes 50 are tested after formation to reduce or prevent subsequent processing of known bad memory cubes 50.

Subsequently, the memory cube 50 may be used in the formation of a high bandwidth memory (HBM) device. Specifically, as will be discussed in greater detail below, the memory cube 50 can be further stacked on a second integrated circuit device to form a HBM device. The second integrated circuit device may have a structure similar to the integrated circuit device 10 discussed above with reference to FIG. 1, and in an embodiment may be a logic device.

In FIG. 2A, a carrier substrate 52 is provided, and a release layer 54 is formed on the carrier substrate 52. The carrier substrate 52 may be a glass carrier substrate, a ceramic carrier substrate, or the like. The carrier substrate 52 may be a wafer, such that multiple memory cubes 50 can be formed on the carrier substrate 52 simultaneously.

The release layer 54 may be formed of a polymer-based material, which may be removed along with the carrier substrate 52 from the overlying structures that will be formed in subsequent steps. In some embodiments, the release layer 54 is an epoxy-based thermal-release material, which loses its adhesive property when heated, such as a light-to-heat-conversion (LTHC) release coating. In other embodiments, the release layer 54 may be an ultra-violet (UV) glue, which loses its adhesive property when exposed to UV lights. The release layer 54 may be dispensed as a liquid and cured, may be a laminate film laminated onto the carrier substrate 52, or may be the like. The top surface of the release layer 54 may be leveled and may have a high degree of planarity.

A wafer 56A is stacked on the carrier substrate 52. The wafer 56A comprises multiple integrated circuit devices, such as a memory device 10A in the device region 52A. The memory device 10A will be singulated in subsequent processing to be included in the memory cube 50. The memory device 10A includes a semiconductor substrate 12A, an interconnect structure 14A, conductive vias 16A, and a dielectric layer 24A, but does not include die connectors in the dielectric layer 24A at this step of processing. The wafer 56A is stacked face-down on the carrier substrate 52 so that a major surface of the dielectric layer 24A faces/contacts the carrier substrate 52. As will be discussed in greater detail below, the memory cube 50 is attached to another integrated circuit device after singulation. Reflowable connectors are used to attach the memory cube 50 to the other integrated circuit device. In some embodiments, die connectors may be formed in the dielectric layer 24A (see below, FIG. 2E). The die connectors are formed after wafer stacking is completed, to prevent damage to the die connectors during wafer stacking.

Figure 2B:
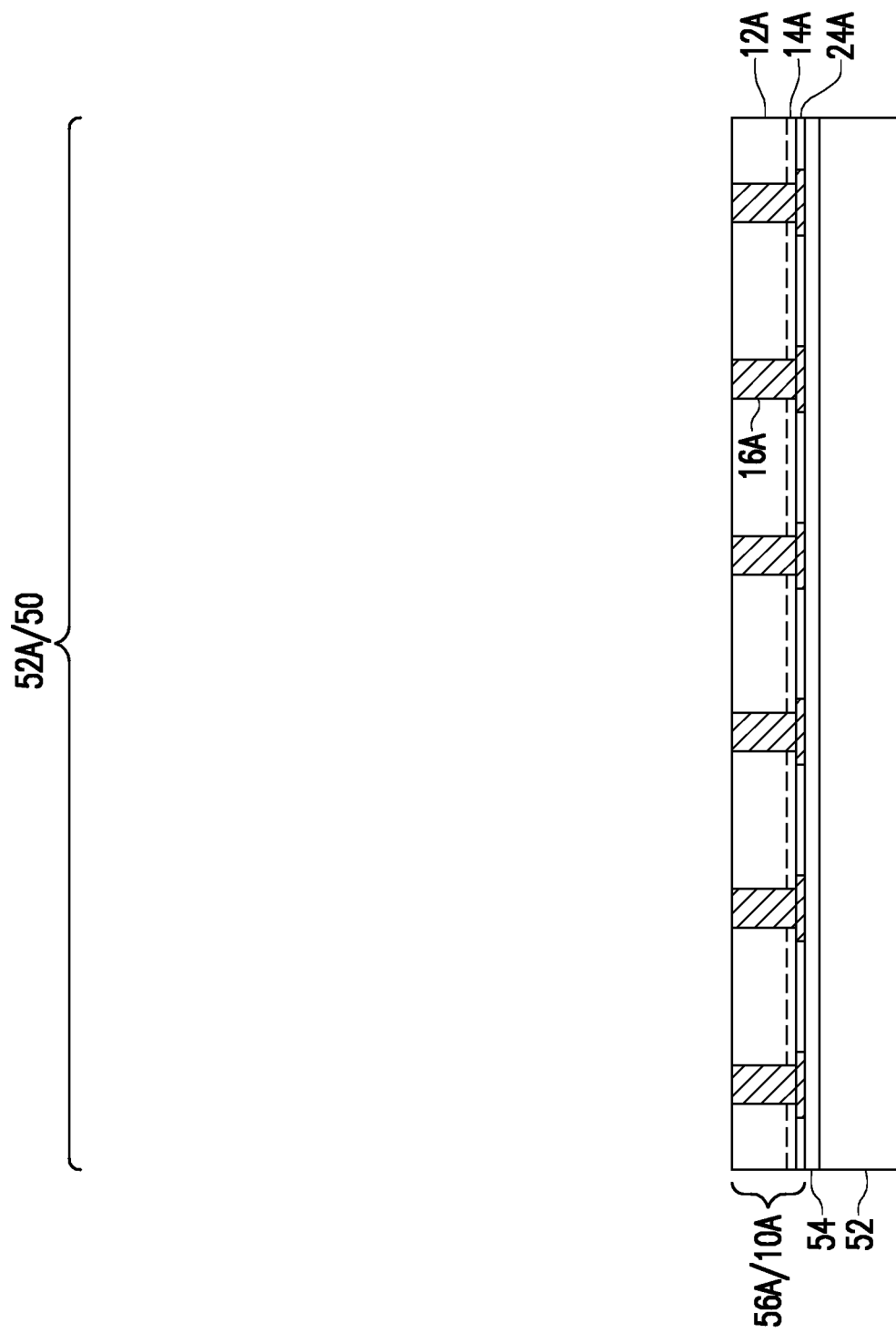

In FIG. 2B, the wafer 56A is thinned. The thinning may be by a CMP process, a grinding process, an etch back process, the like, or combinations thereof, and is performed on the inactive surface of the semiconductor substrate 12A. The thinning exposes the conductive vias 16A. After the thinning, surfaces of the conductive vias 16A and the inactive surface of the semiconductor substrate 12A are coplanar (within process variations). As such, the conductive vias 16A are exposed at the back side of the memory device 10A.

Figure 2C:
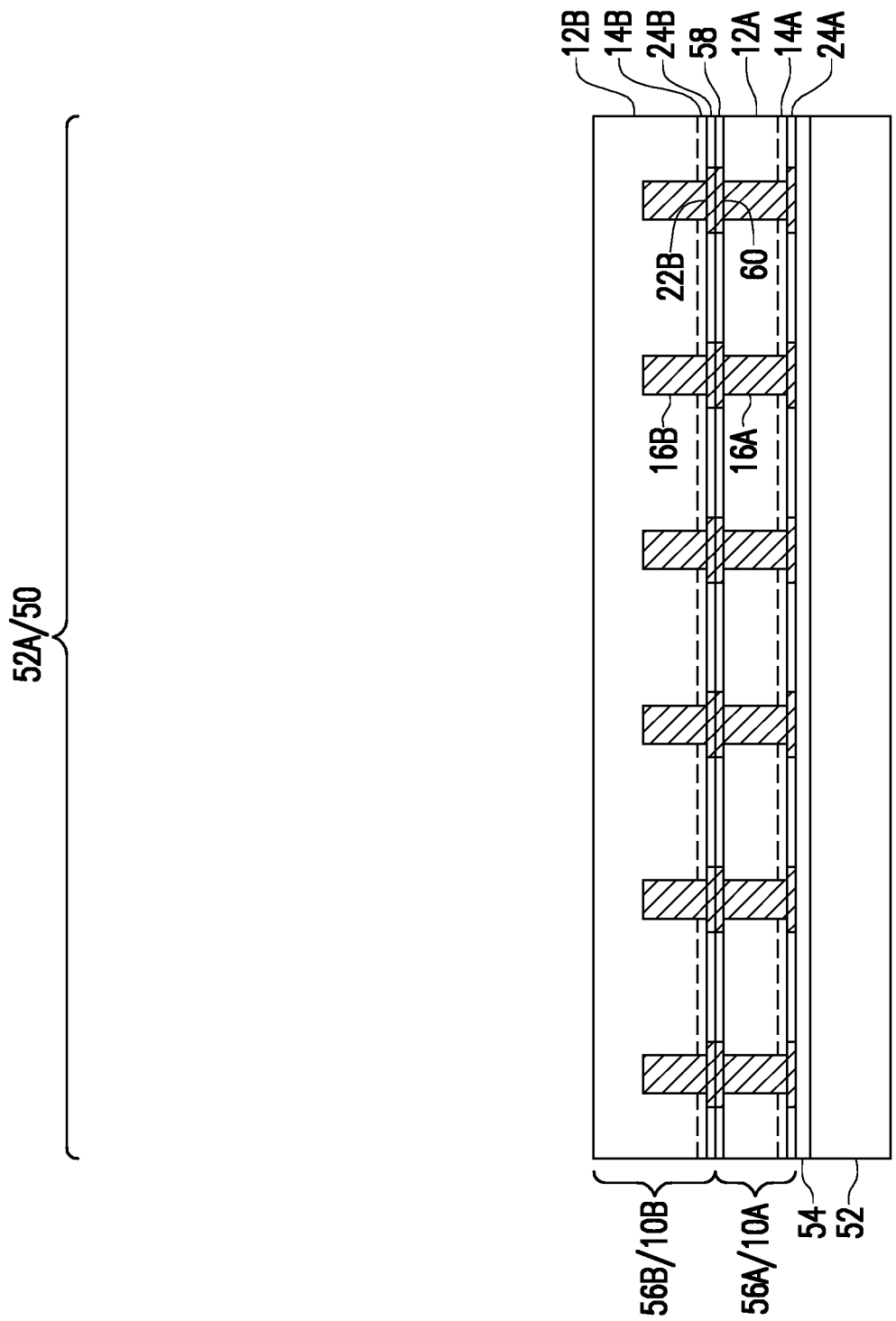

In FIG. 2C, a wafer 56B is stacked over the carrier substrate 52. In particular, the front side of the wafer 56B is attached to the back side of the wafer 56A. The wafer 56B comprises multiple integrated circuit devices, such as a memory device 10B in the device region 52A. The memory device 10B will be singulated in subsequent processing to be included in the memory cube 50. The memory device 10B includes a semiconductor substrate 12B, an interconnect structure 14B, conductive vias 16B, die connectors 22B, and a dielectric layer 24B.

The wafer 56A and the wafer 56B are back-to-face bonded, e.g., are directly bonded in a back-to-face manner by hybrid bonding, such that the back side of the wafer 56A is bonded to the front side of the wafer 56B. Specifically, dielectric-to-dielectric bonds and metal-to-metal bonds are formed between the wafer 56A and the wafer 56B. In the illustrated embodiment, a dielectric layer 58 and die connectors 60 are formed at the back side of the wafer 56A and are used for hybrid bonding.

The dielectric layer 58 is formed at the back side of the wafer 56A, such as on the semiconductor substrate 12A. The dielectric layer 58 is laterally coterminous (within process variations) with sidewalls of the integrated circuit device 10. The dielectric layer 58 may be an oxide such as silicon oxide, PSG, BSG, BPSG, or the like; a nitride such as silicon nitride or the like; a polymer such as polybenzoxazole (PBO), polyimide, a benzocyclobutene (BCB) based polymer, or the like; the like; or a combination thereof. The dielectric layer 58 may be formed, for example, by spin coating, lamination, chemical vapor deposition (CVD), or the like. In some embodiments (discussed in greater detail below), the semiconductor substrate 12A is recessed before forming the dielectric layer 58 so that the dielectric layer 58 surrounds the conductive vias 16A.

The die connectors 22A are formed at the back side of the wafer 56A, and are in physical contact with the conductive vias 16A. The die connectors 22A may be conductive pillars, pads, or the like, to which external connections are made. The die connectors 22A can be formed of a metal, such as copper, aluminum, or the like, and can be formed by, for example, plating, or the like. The die connectors 22A are electrically connected to integrated circuits of the memory device 10A by the conductive vias 16A. After formation, the dielectric layer 58 and the die connectors 60 are planarized using, e.g., a CMP process, an etch back process, the like, or combinations thereof. After planarization, the top surfaces of the die connectors 22A and dielectric layer 58 are coplanar (within process variations) and are exposed at the back side of the wafer 56A.

The dielectric layer 58 is bonded to the dielectric layer 24B through dielectric-to-dielectric bonding, without using any adhesive material (e.g., die attach film), and the die connectors 60 are bonded to the die connectors 22B through metal-to-metal bonding, without using any eutectic material (e.g., solder). The bonding may include a pre-bonding and an annealing. During the pre-bonding, a small pressing force is applied to press the wafer 56B against the wafer 56A. The pre-bonding is performed at a low temperature, such as room temperature, such as a temperature in the range of 15° C. to 30° C., and after the pre-bonding, the dielectric layer 24B and the dielectric layer 58 are bonded to each other. The bonding strength is then improved in a subsequent annealing step, in which the dielectric layer 24B and the dielectric layer 58 are annealed at a high temperature, such as a temperature in the range of 140° C. to 280° C. After the annealing, bonds, such as fusions bonds, are formed bonding the dielectric layer 24B and the dielectric layer 58. For example, the bonds can be covalent bonds between the material of the dielectric layer 58 and the material of the dielectric layer 24B. The die connectors 22B and the die connectors 60 are connected to each other with a one-to-one correspondence. The die connectors 22B and the die connectors 60 may be in physical contact after the pre-bonding, or may expand to be brought into physical contact during the annealing. Further, during the annealing, the material of the die connectors 22B and the die connectors 60 (e.g., copper) intermingles, so that metal-to-metal bonds are also formed. Hence, the resulting bonds between the wafer 56A and the wafer 56B are hybrid bonds that include both dielectric-to-dielectric bonds and metal-to-metal bonds.

In another embodiment, the die connectors 60 are omitted. The dielectric layer 58 is bonded to the dielectric layer 24B through dielectric-to-dielectric bonding, without using any adhesive material (e.g., die attach film), and the conductive vias 16A are bonded to the die connectors 22B through metal-to-metal bonding, without using any eutectic material (e.g., solder).

In yet another embodiment, the dielectric layer 58 and the die connectors 60 are omitted. The semiconductor substrate 12A may be bonded to the dielectric layer 24B through dielectric-to-dielectric bonding, without using any adhesive material (e.g., die attach film), and the conductive vias 16A may be bonded to the die connectors 22B through metal-to-metal bonding, without using any eutectic material (e.g., solder). For example, an oxide, such as a native oxide, a thermal oxide, or the like, may be formed on the inactive surface of the semiconductor substrate 12A, and may be used for the dielectric-to-dielectric bonding.

Figure 2D:
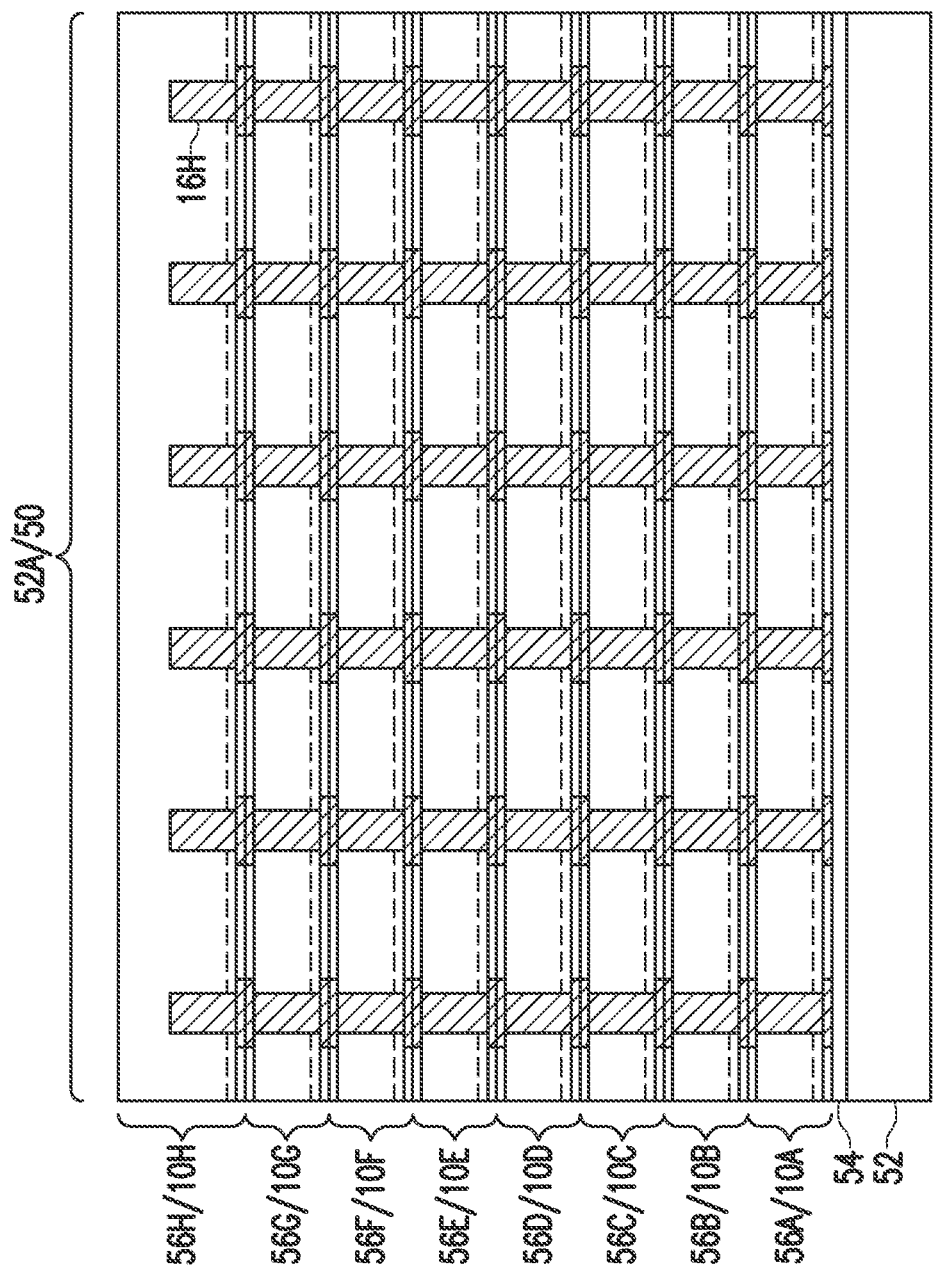

In FIG. 2D, the steps described above are repeated so that wafers 56C, 56D, 56E, 56F, 56G, 56H are stacked over the carrier substrate 52. The wafers 56C, 56D, 56E, 56F, 56G, 56H each comprise multiple integrated circuit devices, such as, respectively, memory devices 10C, 10D, 10E, 10F, 10G, 10H in the device region 52A. The memory devices 10C, 10D, 10E, 10F, 10G, 10H will be singulated in subsequent processing to be included in the memory cube 50. Each of the wafers 56C, 56D, 56E, 56F, 56G, 56H is directly bonded to, respectively, the wafers 56B, 56C, 56D, 56E, 56F, 56G in a back-to-face manner by hybrid bonding. The last wafer that is stacked, e.g., the wafer 56H, may not be thinned, such that conductive vias 16H of the wafer 56H remain electrically insulated.

Figure 2E:
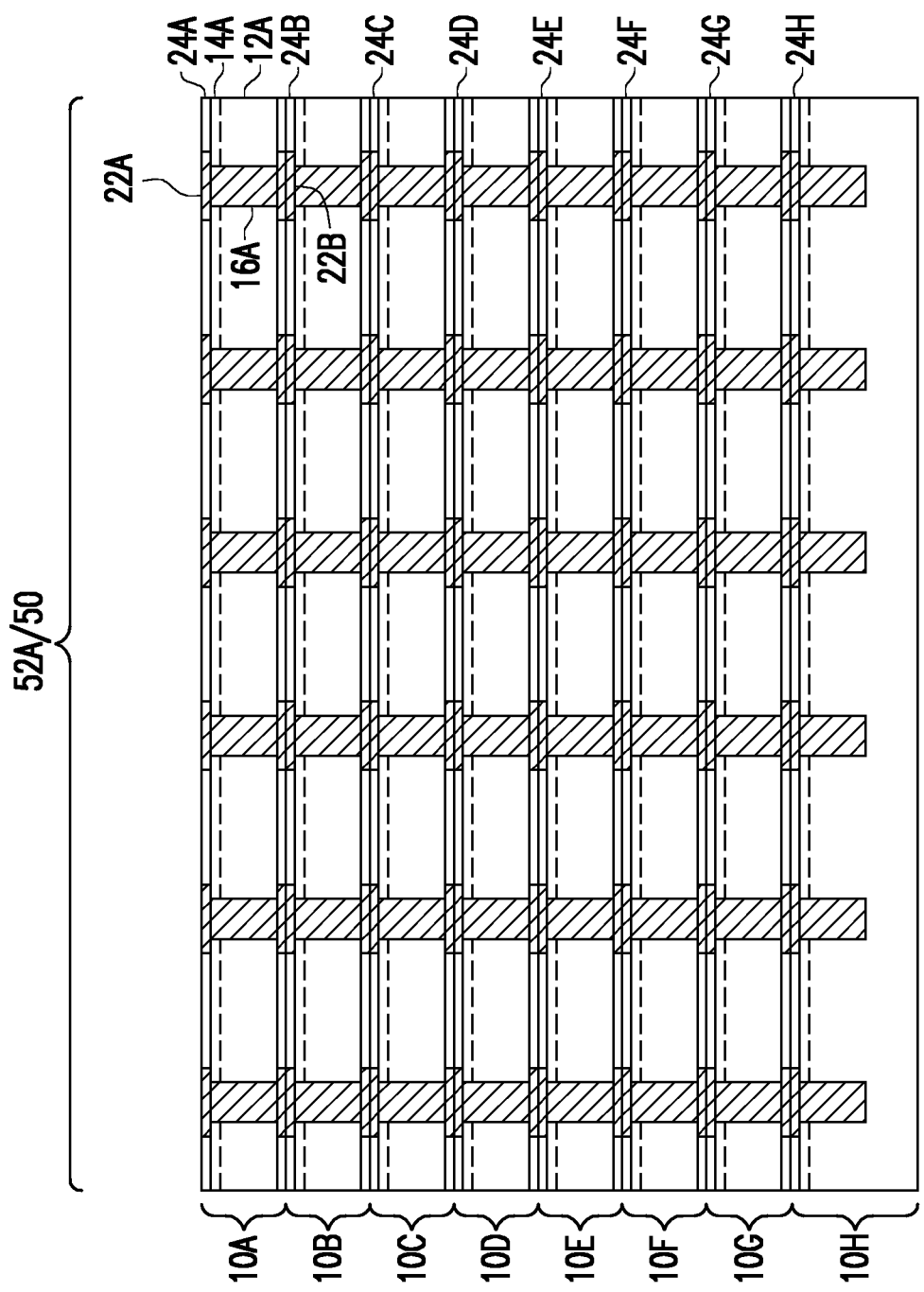

In FIG. 2E, a carrier substrate debonding is performed to detach (or "debond") the carrier substrate 52 from the wafer stack, e.g., the wafer 56A. In accordance with some embodiments, the debonding includes projecting a light such as a laser light or an UV light on the release layer 54 so that the release layer 54 decomposes under the heat of the light and the carrier substrate 52 can be removed. Removing the carrier substrate 52 exposes the major surface of the upper memory device (e.g., the memory device 10A) of the memory cube 50. The wafer stack is then flipped over and placed on a tape (not shown).

Die connectors 22A are then formed for the top layer of the memory cube 50, e.g., at a front side of the wafer 56A. The die connectors 22A are used to subsequently connect the memory cube 50 to another device such as e.g. a wafer 102 (see below, FIG. 3C). The die connectors 22A may be formed of a similar material and by a similar method as the die connectors 60 as described above in respect to FIG. 2C. The die connectors 22A are electrically connected to integrated circuits of the memory device 10A by the conductive vias 16A. After formation, the dielectric layer 24A and the die connectors 22A are planarized using, e.g., a CMP process, an etch back process, the like, or combinations thereof. After planarization, the top surfaces of the die connectors 22A and dielectric layer 24A are coplanar (within process variations) and are exposed at the front side of the wafer 56A.

Figure 2F:
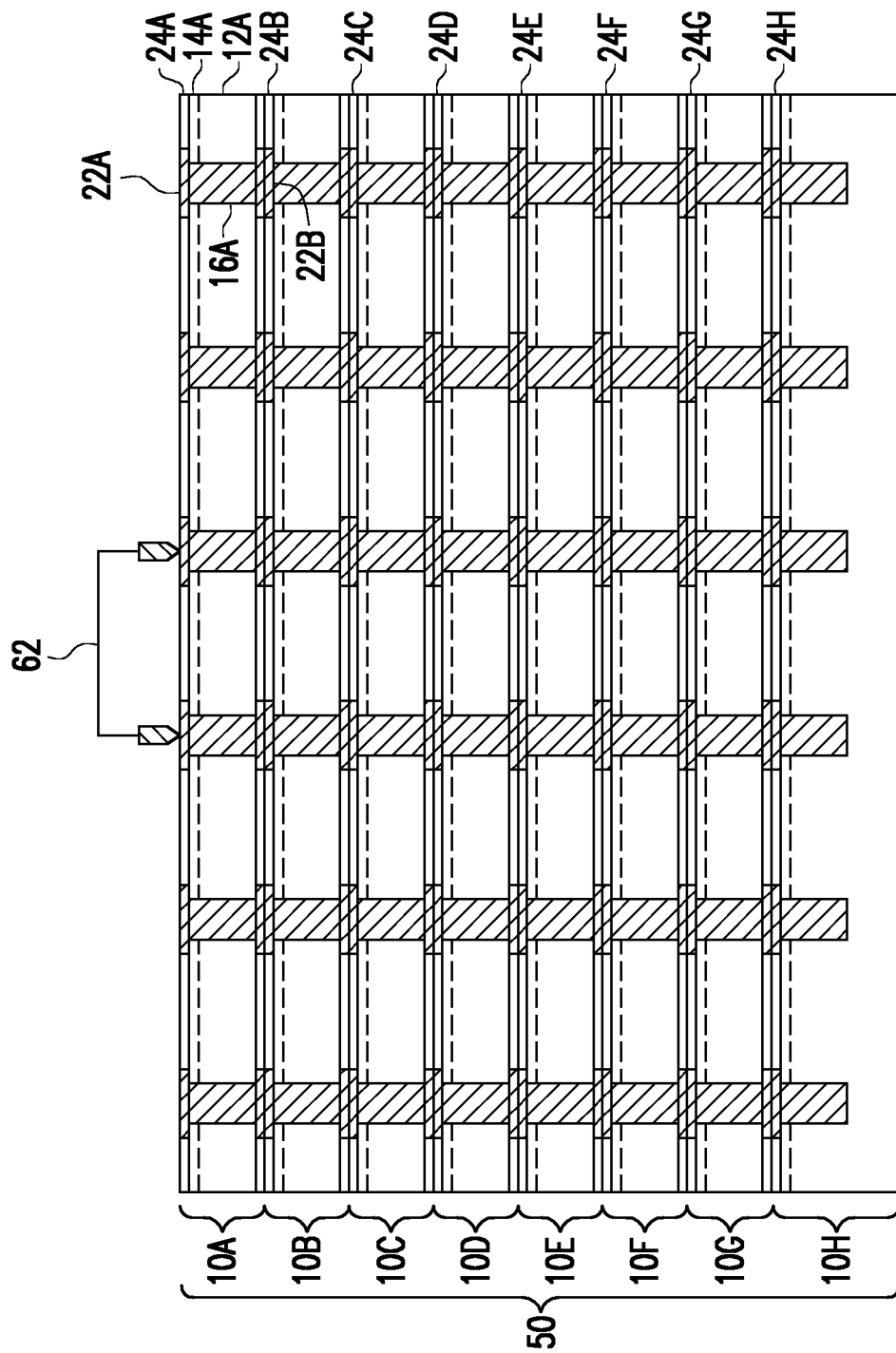

In FIG. 2F, a singulation process is performed along scribe line regions, e.g., between the device region 52A and adjacent device regions. The singulation may be by sawing, laser cutting, or the like. The singulation process can be performed before or after the die connectors 22A are formed. The singulation separates the device region 52A from adjacent device regions. The resulting, singulated memory cube 50 is from the device region 52A. The memory devices of the memory cube 50 are laterally coterminous (within process variations) after singulation.

It should be appreciated that the memory cube 50 may include any number of layers. In the embodiment shown, the memory cube 50 includes eight layers. In another embodiment, the memory cube 50 includes more or less than eight layers, such as two layers, four layers, sixteen layers, thirty two layers, or the like.

After formation of the memory cube 50 is complete (e.g., after formation of the die connectors 22A and singulation of the memory cube 50), the resulting memory cube 50 is tested by use of a probe 62. The probe 62 is physically and electrically connected to the die connectors 22A. The die connectors 22A are used to test the memory cube 50, such that only known good memory cubes are used for further processing. The testing may include testing of the functionality of the memory devices 10A, 10B, 10C, 10D, 10E, 10F, 10G, 10H, or may include testing for known open or short circuits that may be expected based on the design of the memory devices. During the testing, all of the memory devices of the memory cube 50 may be tested in a daisy-chain manner.

FIGS. 3A through 3D are cross-sectional views of intermediate steps during a process for forming a HBM device 100, in accordance with some embodiments. As will be discussed in greater detail below, FIGS. 3A through 3D illustrate a process in which a HBM device 100 is formed by stacking a memory cube 50 on a second integrated circuit device (e.g., a logic device 10L, see FIG. 3A). The second integrated circuit device is a bare die, which can be formed in a wafer 102. Formation of a HBM device 100 in one device region 102A of the wafer 102 is illustrated, but it should be appreciated that the wafer 102 may have any number of device regions, and a HBM device 100 may be formed in each device region.

In FIG. 3A the wafer 102 is obtained. The wafer 102 comprises a logic device 10L in the device region 102A. The logic device 10L will be singulated in subsequent processing to be included in the HBM device 100. The logic device 10L can be an interface device, buffer device, controller device, or the like for the memory devices of the memory cube 50. In some embodiments, the logic device 10L provides the input/output (I/O) interface for the HBM device 100. The logic device 10L includes a semiconductor substrate 12L, an interconnect structure 14L, conductive vias 16L, die connectors 22L, and a dielectric layer 24L.

The die connectors 22L are used for connections to other devices, such as devices in an integrated circuit package in which the HBM device 100 can be implemented. In some embodiments, the die connectors 22L are conductive bumps that are suitable for use with reflowable connectors, such as microbumps, extending through the dielectric layer 24L. The die connectors 22A may have substantially vertical sidewalls (within process variations). In the illustrated embodiment, the die connectors 22L are formed through the dielectric layer 24L to couple the metallization patterns of the interconnect structure 14L. As an example to form the die connectors 22L, openings are formed in the dielectric layer 24L, and a seed layer is formed over the dielectric layer 24L and in the opening. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the die connectors 22L. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, nickel, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the die connectors 22L.

Figure 3B:
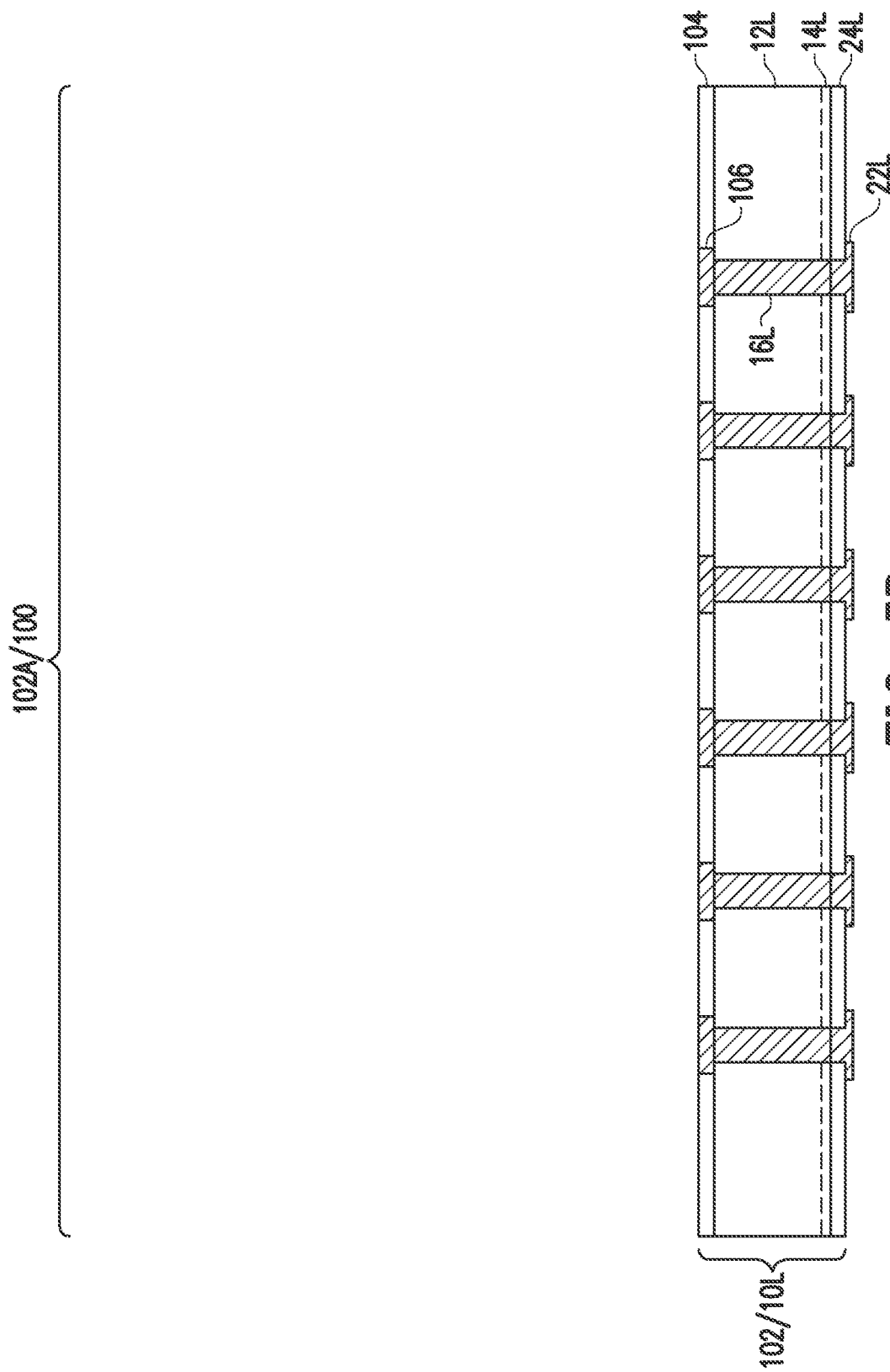

In FIG. 3B, the wafer 102 is thinned. The thinning may be by a CMP process, a grinding process, an etch back process, the like, or combinations thereof, and is performed on the inactive surface of the semiconductor substrate 12L. The thinning exposes the conductive vias 16L. After the thinning, surfaces of the conductive vias 16L and the inactive surface of the semiconductor substrate 12L are coplanar (within process variations). As such, the conductive vias 16L are exposed at the back side of the logic device 10L.

A dielectric layer 104 is then formed over the wafer 102, e.g., at the back side of the logic device 10L. The dielectric layer 104 may be formed of a similar material and by a similar method as the dielectric layer 58 described with respect to FIG. 2C. Die connectors 106 are then formed extending through the dielectric layer 104. The die connectors 106 may be formed of a similar material and by a similar method as the die connectors 22A described with respect to FIG. 2E. For example, the die connectors 106 may be conductive pillars, pads, or the like that are suitable for use with metal-to-metal bonding, without using any eutectic material (e.g., solder). The die connectors 106 are physically connected to the conductive vias 16L, and are electrically connected to integrated circuits of the logic device 10L by the conductive vias 16L.

Figure 3C:
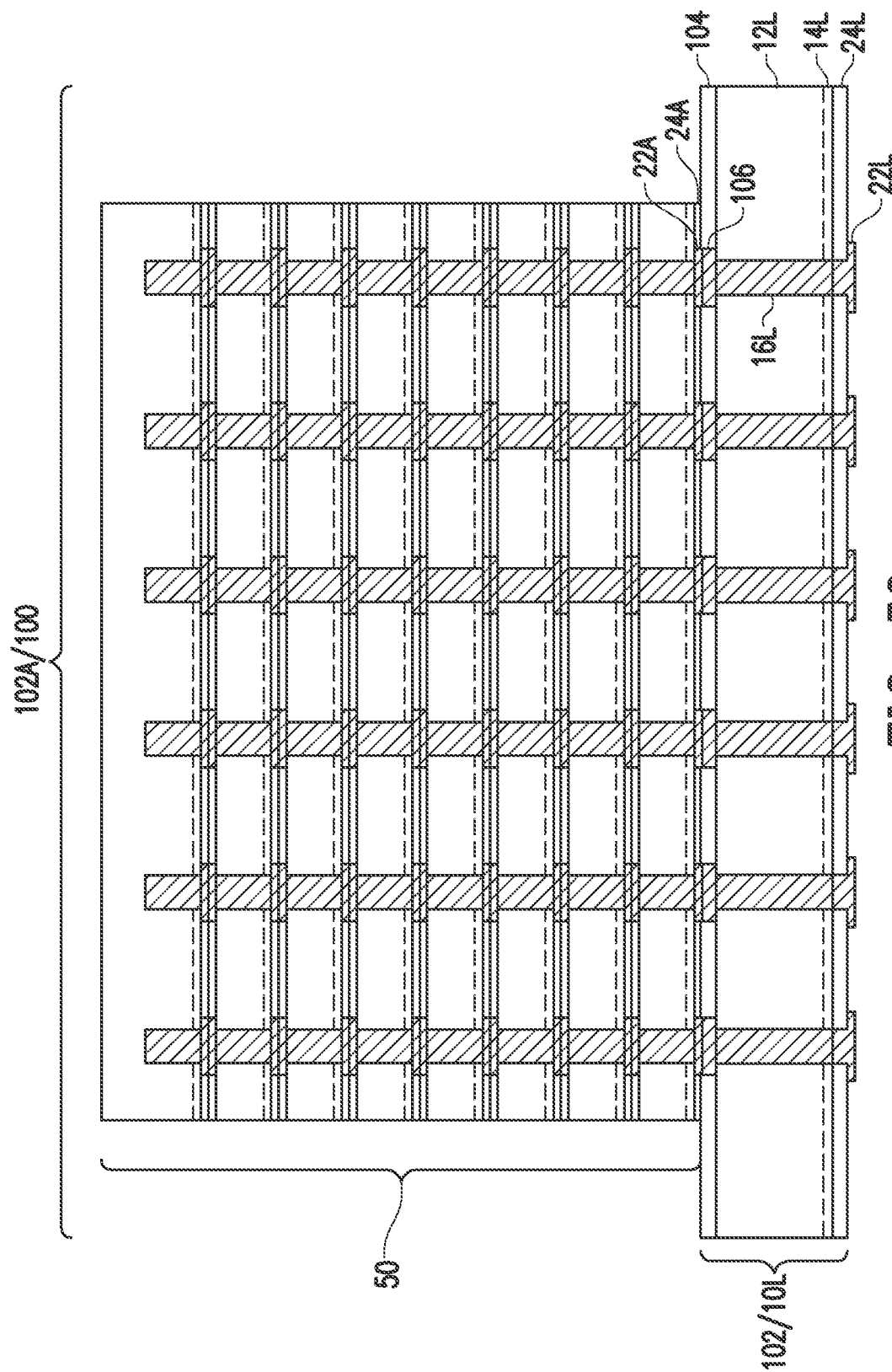

In FIG. 3C, a memory cube 50 is attached to the wafer 102, e.g., to the back side of the logic device 10L. The wafer 102 and the memory cube 50 are back-to-face bonded, e.g., are directly bonded in a back-to-face manner by hybrid bonding, such that the back side of the wafer 102 is bonded to the front side of the memory cube 50. Specifically, dielectric-to-dielectric bonds are formed between the dielectric layer 104 of the wafer 102 and the dielectric layer 24A of the memory cube 50, and metal-to-metal bonds are formed between the die connectors 106 of the wafer 102 and the die connectors 22A of the memory cube 50. The hybrid bonding of the wafer 102 and the memory cube 50 may be performed using similar methods as described above for the hybrid bonding of the wafer 56A and the wafer 56B in respect to FIG. 2C.

Figure 3D:
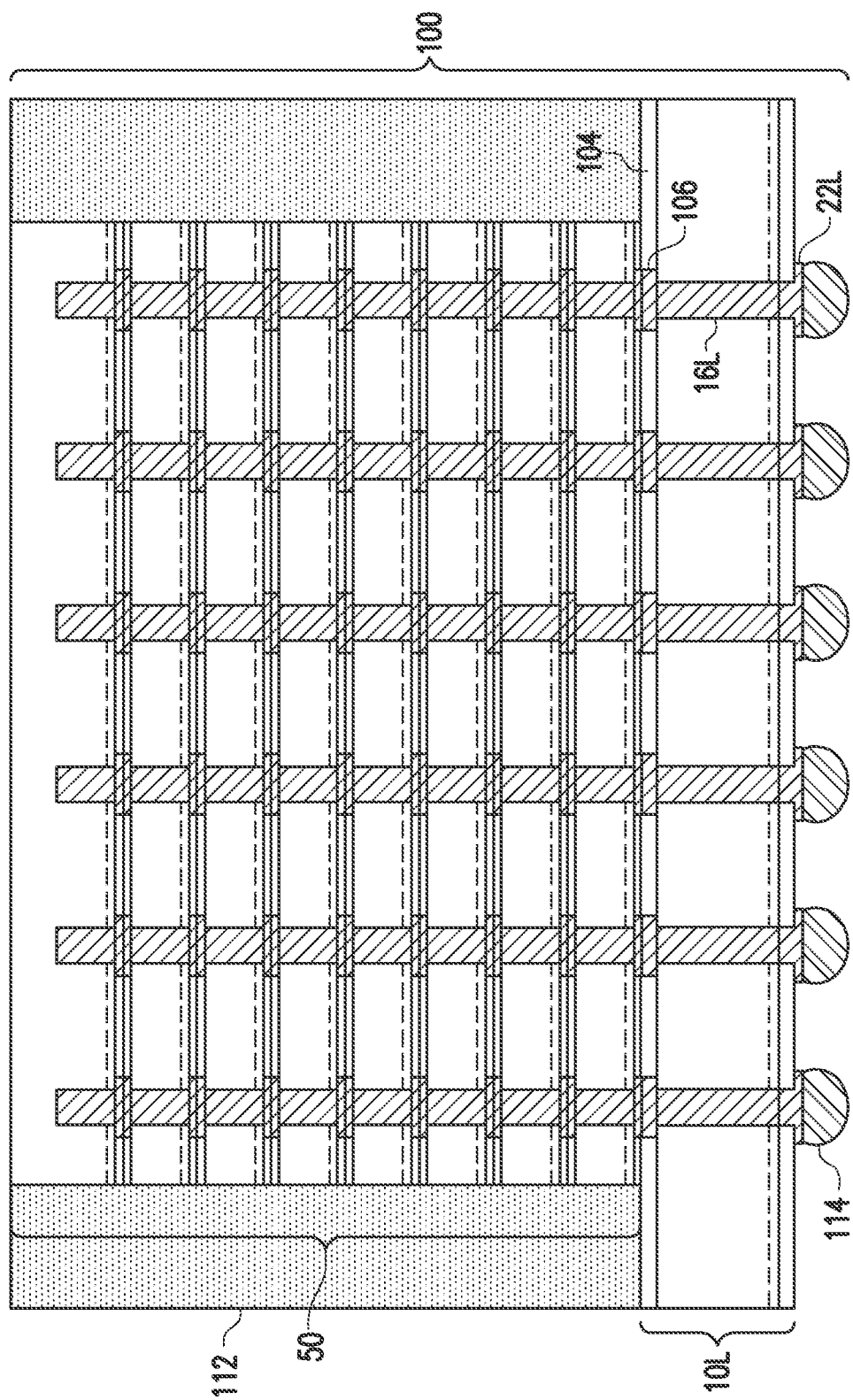

In FIG. 3D, an encapsulant 112 is formed on and around the various components. After formation, the encapsulant 112 encapsulates the memory cube 50 and contacts a top surface of the dielectric layer 104 and each memory device of the memory cube 50. The encapsulant 112 may be a molding compound, epoxy, or the like. The encapsulant 112 may be applied by compression molding, transfer molding, or the like, and may be formed over the wafer 102 such that the memory cube 50 is buried or covered. The encapsulant 112 may be applied in liquid or semi-liquid form and then subsequently cured. A planarization process is optionally performed on the encapsulant 112 to expose the memory cube 50. After the planarization process, top surfaces of the memory cube 50 and the encapsulant 112 are coplanar (within process variations). The planarization process may be, for example, a chemical-mechanical polish (CMP), a grinding process, or the like. In some embodiments, the planarization may be omitted, for example, if the memory cube 50 is already exposed.

A singulation process is then performed along scribe line regions, e.g., around the device region 102A. The singulation may be by sawing, laser cutting, or the like. The singulation process separates the device region 102A (comprising the logic device 10L) from adjacent device regions to form an HBM device 100 comprising the logic device 10L. The singulated logic device 10L has a greater width than each memory device of the memory cube 50. After singulation, the logic device 10L and the encapsulant 112 are laterally coterminous (within process variations).

Conductive connectors 114 are formed on the die connectors 22L. The conductive connectors 114 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 114 may include a conductive material such as solder, copper, aluminum, gold, nickel, silver, palladium, tin, the like, or a combination thereof. In some embodiments, the conductive connectors 114 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 114 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. The conductive connectors 114 may be formed before or after the singulation process. The conductive connectors 114 will be used for external connection (discussed further below).

The example electronic device (HBM device 100) as illustrated in FIG. 3D is provided for illustrative purposes only to further explain applications of the disclosed embodiments, and is not meant to limit the disclosed embodiments in any manner. Subsequently, the HBM device 100 is used in the formation of an integrated circuit package. Specifically, as will be discussed in greater detail below, the HBM device 100 is packaged in a three-dimensional integrated circuit (3DIC) package, such as a system-in-package (SiP). Examples of a 3DIC package include a chip-on-wafer (CoW) package, a chip-on-wafer-on-substrate (CoWoS) package, an integrated fan-out (InFO) package, and the like, although it should be appreciated that embodiments may be applied to other 3DIC packages.

FIGS. 4 through 11C are cross-sectional views of intermediate steps during a process for forming integrated circuit packages, in accordance with some embodiments. As will be discussed in greater detail below, FIGS. 4 through 10 illustrate a process in which a HBM device 100 is packaged into an integrated circuit package 300 (see FIG. 9), such as a CoW package. The integrated circuit package 300 is then mounted to a package substrate 400 (see FIG. 11A) to form another package, such as a CoWoS package. The integrated circuit package 300 is formed by stacking the HBM device 100 and a third integrated circuit device on a wafer 302. The third integrated circuit device may have a structure similar to the integrated circuit device 10 discussed above with reference to FIG. 1, and in an embodiment may be a logic device or a processor device. Formation of integrated circuit packages in one package region 302A of the wafer 302 is illustrated, but it should be appreciated that the wafer 302 may have any number of device regions, and a HBM device 100 may be stacked in each device region.

Figure 4:
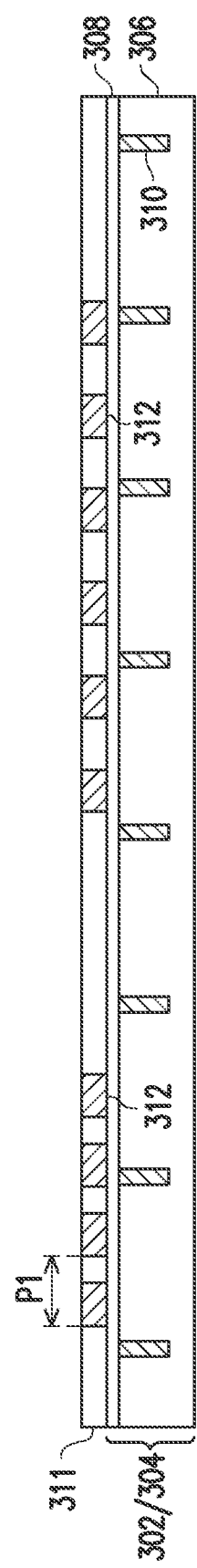
FIGS. 4 through 11C are cross-sectional views of intermediate steps during a process for forming integrated circuit packages, in accordance with some embodiments.

In FIG. 4 the wafer 302 is obtained. The wafer 302 comprises an interposer 304 in the package region 302A. The interposer 304 will be singulated in subsequent processing to be included in the integrated circuit package 300. The interposer 304 includes a semiconductor substrate 306, an interconnect structure 308, conductive vias 310, a dielectric layer 311, and die connectors 312, which can be similar to, respectively, the semiconductor substrate 12, the interconnect structure 14, the conductive vias 16, the dielectric layer 24, and the die connectors 22 of the integrated circuit device 10 discussed above with reference to FIG. 1, except the semiconductor substrate 306 may be free of active/passive devices. The die connectors 312 may be a metal such as copper, titanium, aluminum, the like, or a combination thereof. The die connectors 312 may have a pitch P1 in a range of 1 μm to 10 μm, which may allow for fine pitch hybrid bonding with a subsequently attached logic device (see below, FIG. 5A).

Figure 5A:
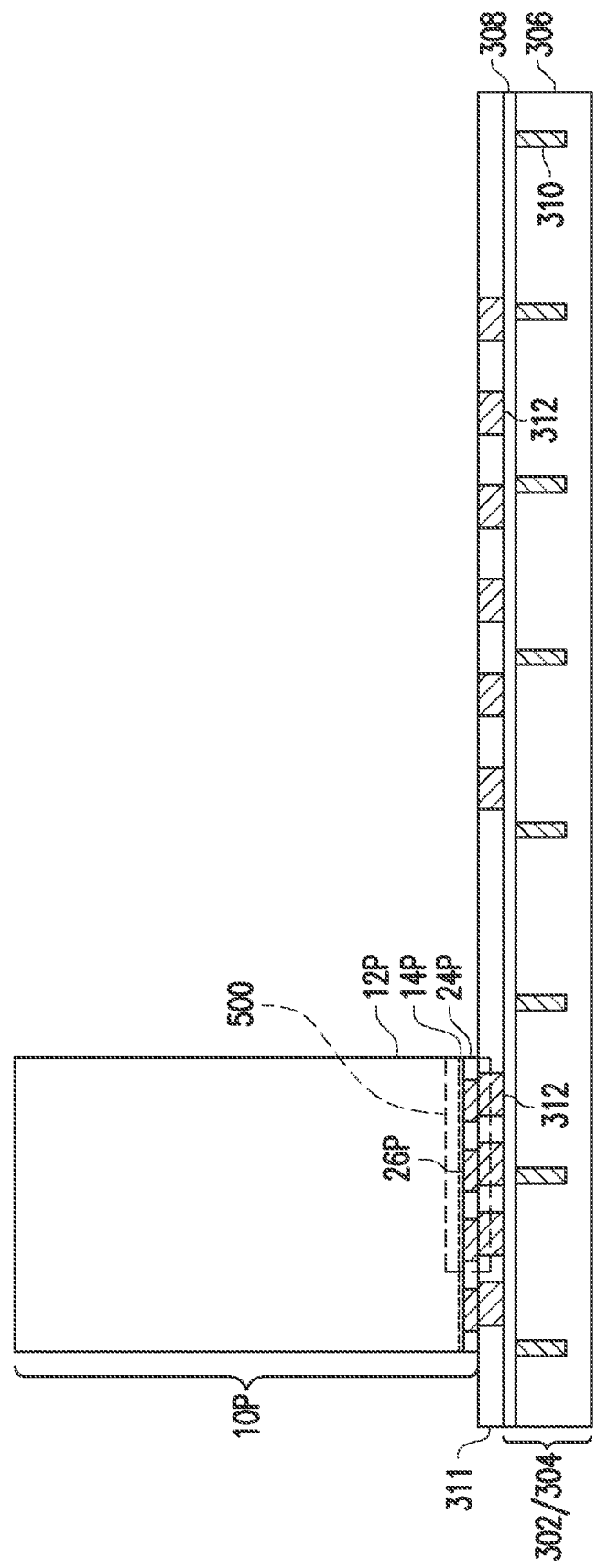
Figure 5B:
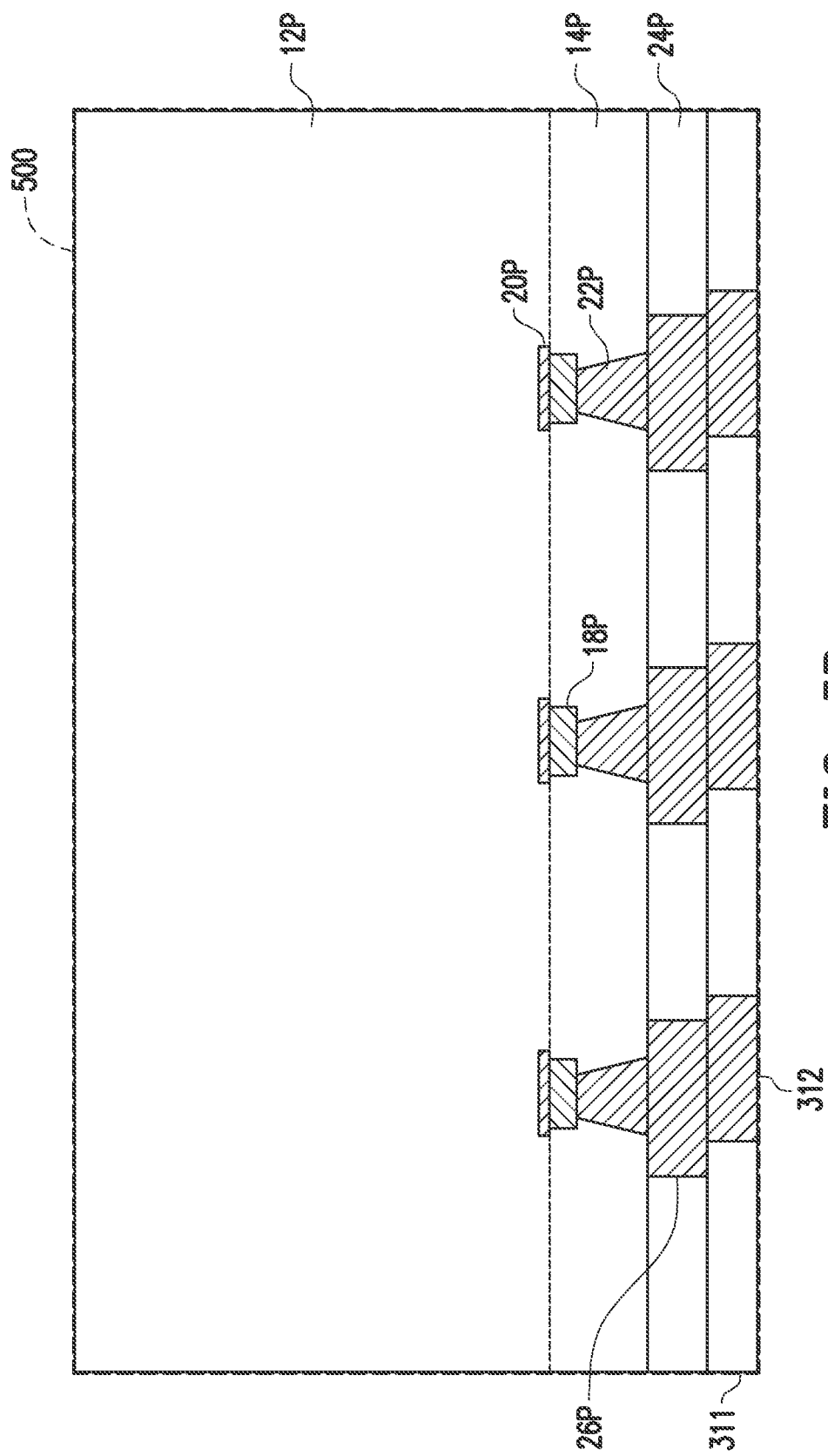

In FIG. 5A, a logic die such as a processor device 10P is attached to the front side of the wafer 302, e.g., to the interconnect structure 308 of the interposer 304. FIG. 5B illustrates a view of region 500 as illustrated in FIG. 5A. The processor device 10P can be a processing unit, such as a CPU, a GPU, a SoC, or the like. In some embodiments, the processor device 10P includes a semiconductor substrate 12P, conductive features 20P, an interconnect structure 14P on the front side of the semiconductor substrate 12P, conductive pads 18P, conductive vias 22P, a dielectric layer 24P, and die connectors 26P. In some embodiments, the processor device 10P is free of TSVs. The conductive features 20P may be, e.g., conductive lines or other top metal features connected to logic circuitry in the semiconductor substrate 12P. The conductive pads 18P may be e.g. aluminum pads on the conductive features 20P that can be used for external connection through the interconnect structure 14P or for connection to a probe 62 (see above, FIG. 2F) for testing to determine if the processor device 10P is a known good die. Conductive vias 22P in the interconnect structure 14P may connect the conductive pads 18P to the die connectors 26P. In some embodiments, multiple layers of conductive vias and/or conductive lines may connect the conductive pads 18P to the die connectors 26P through the interconnect structure 14P. The dielectric layer 24P may be formed of a similar material and by a similar method as the dielectric layer 24 described above with respect to FIG. 1. The die connectors 26P may be formed of a similar material, such as copper, titanium, aluminum, the like, or a combination thereof, and by a similar method as the die connectors 22 described above with respect to FIG. 1.

The processor device 10P and the interposer 304 are face-to-face bonded, e.g., are directly bonded in a face-to-face manner by hybrid bonding, such that the front side of the processor device 10P is bonded to the front side of the interposer 304. Specifically, dielectric-to-dielectric bonds are formed between the dielectric layer 24P and the dielectric layer 311 and metal-to-metal bonds are formed between the die connectors 26P and the die connectors 312. The hybrid bonding may be performed by a similar method as the bonding of the wafer 56A and the wafer 56B as described above with respect to FIG. 2C. The metal-to-metal bonds between the die connectors 26P and the die connectors 312 may be Cu—Cu bonds, Ti—Ti bonds, Al—Al bonds, Cu—Ti bonds, Cu—Al bonds, Ti—Al bonds, or a combination thereof.

Figure 5C:
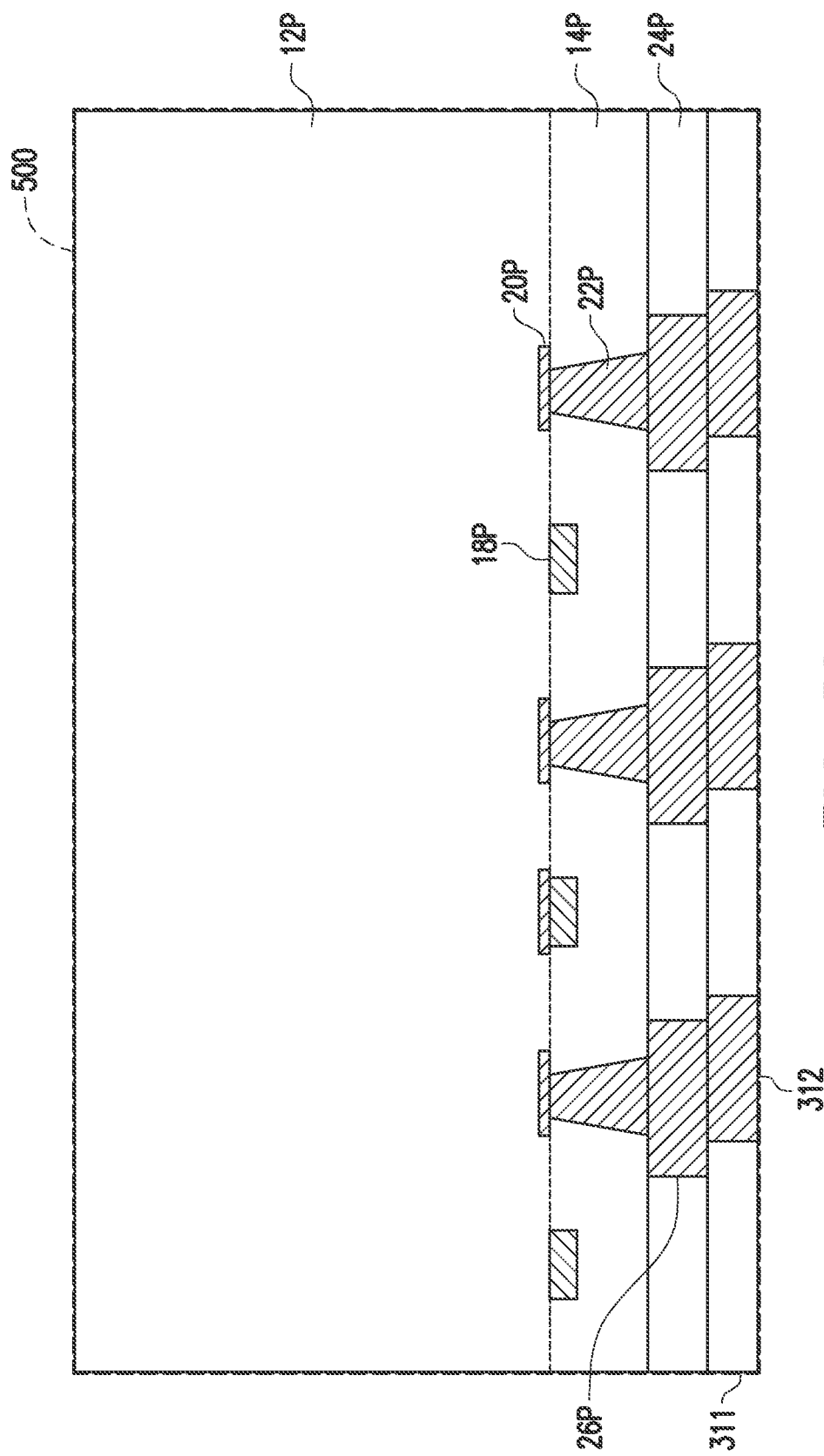

FIG. 5C illustrates an embodiment in which the conductive vias 22P are formed directly on the conductive features 20P. The conductive pads 18P may be coupled to other conductive features 20P and may be used for connection to probes 62 (see above, FIG. 2F) during a testing process to determine if the processor device 10P is a known good die prior to forming the interconnect structure 14P.

Figure 6A:
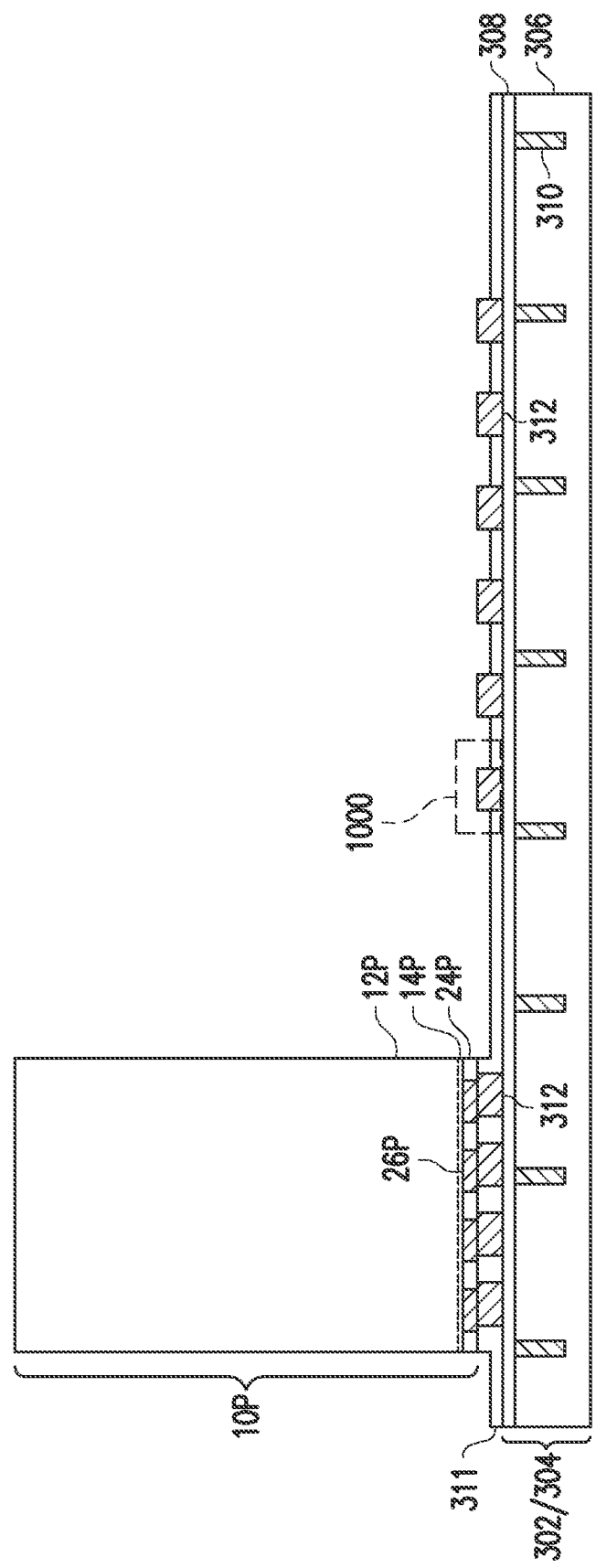

In FIG. 6A, exposed portions of the dielectric layer 311 is recessed by a self-aligned process, using the attached processor device 10P as a mask for the recessing of the dielectric layer 311. Recessing the dielectric layer 311 exposes greater surface areas of die connectors 312 not attached to the processor device 10P and widens the gap between the interposer 304 and a subsequently attached memory device, such as e.g. an HBM device 100 (see below, FIGS. 7A and 7B). This may provide a sufficient process window for forming solder joints and underfill filling to enhance the bonding strength between the interposer 304 and the HBM device 100. As an example of the recession, the dielectric layer 311 may be recessed, e.g., using a plasma etching which utilizes a plasma from a one or more etchants including $CH_4$, $CF_4$, $CH_2F_2$, $CHF_3$, $O_2$, HBr, $Cl_2$, $NF_3$, $N_2$, He, the like, or a combination thereof. However, other removal methods, such as wet etching using an etchant such as HF, or $H_2$, a dry etch with etchants such as $NH_3/NF_3$, chemical oxide removal, or dry chemical clean may be alternatively, conjunctively, or sequentially employed. The recessing process is self-aligned by using the processor device 10P to cover the portions of the dielectric layer 311 used to bond with the processor device 10P.

FIG. 6B illustrates a view of region 1000 as illustrated in FIG. 6A showing the dielectric layer 311 and a die connector 312 after the recessing. In some embodiments, the die connector 312 has a height H1 in a range of 5 μm to 10 μm, and the dielectric layer 311 is recessed to a height H2 below a top surface of the die connector 312 in a range of 5 μm to 10 μm. The height H2 being in a range of 5 μm to 10 μm may be advantageous for exposing a portion of the sidewall of the die connector 312 to improve bonding strength between the interposer 304 and a subsequently attached HBM device 100. The height H2 being less than 5 μm may not expose enough of the sidewall of the die connector 312, leading to worse bonding strength between the interposer 304 and a subsequently attached HBM device 100. The height H2 being greater than 10 μm may lead to too much of the die connector 312 being above the dielectric layer 311, increasing the probability of the die connector 312 detaching from the interposer 304.

A ratio of H1:H2 may be in a range of 1 to 3, which may be advantageous for exposing a proportion of the sidewall of the die connector 312 to improve bonding strength between the interposer 304 and a subsequently attached HBM device 100. The ratio of H1:H2 being less than 1 may lead to too large a proportion of the die connector 312 being above the dielectric layer 311, increasing the probability of the die connector 312 detaching from the interposer 304. The ratio of H1:H2 being greater than 3 may expose too small of a proportion of the sidewall of the die connector 312, leading to worse bonding strength between the interposer 304 and a subsequently attached HBM device 100.

Figure 7A:
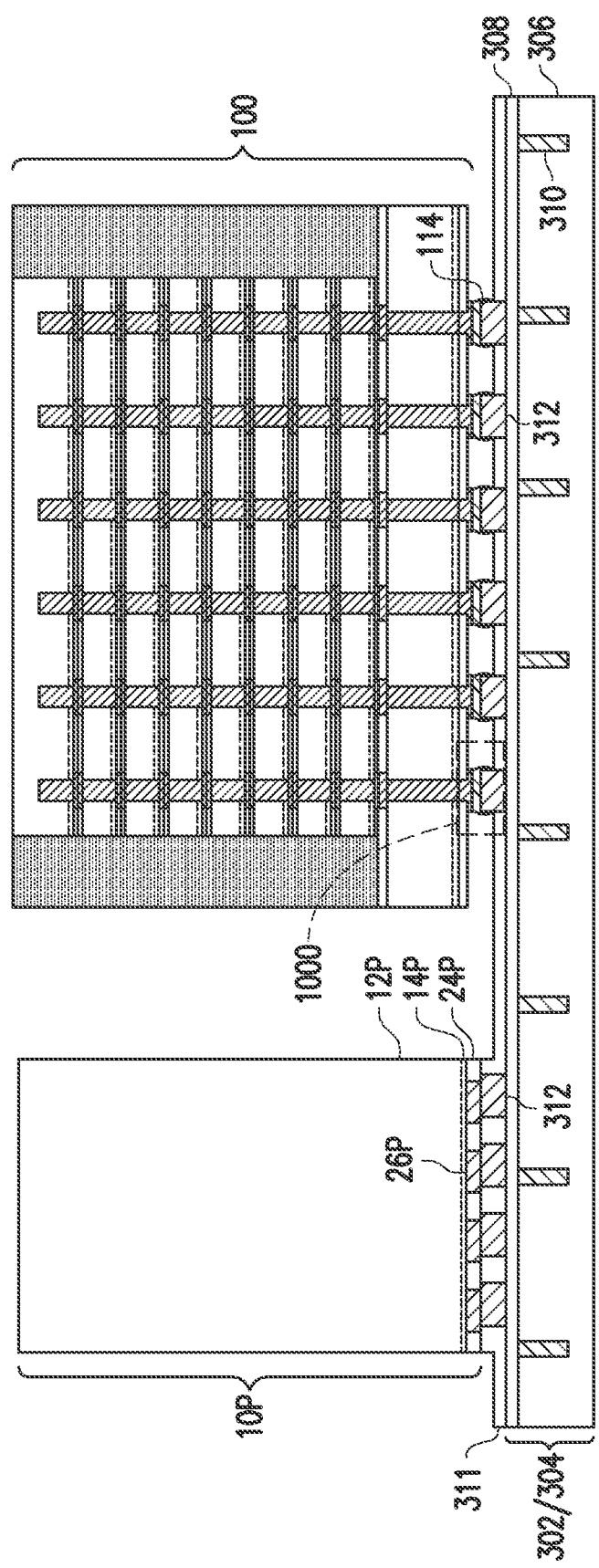
Figure 7B:
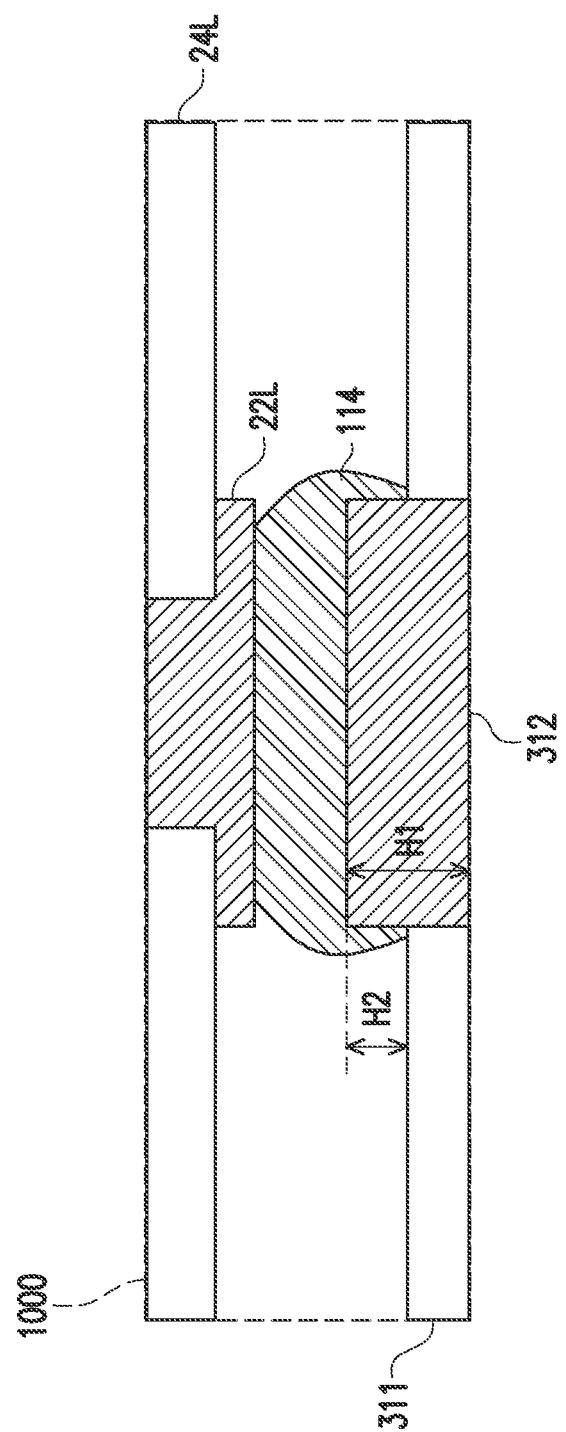
Figure 7C:
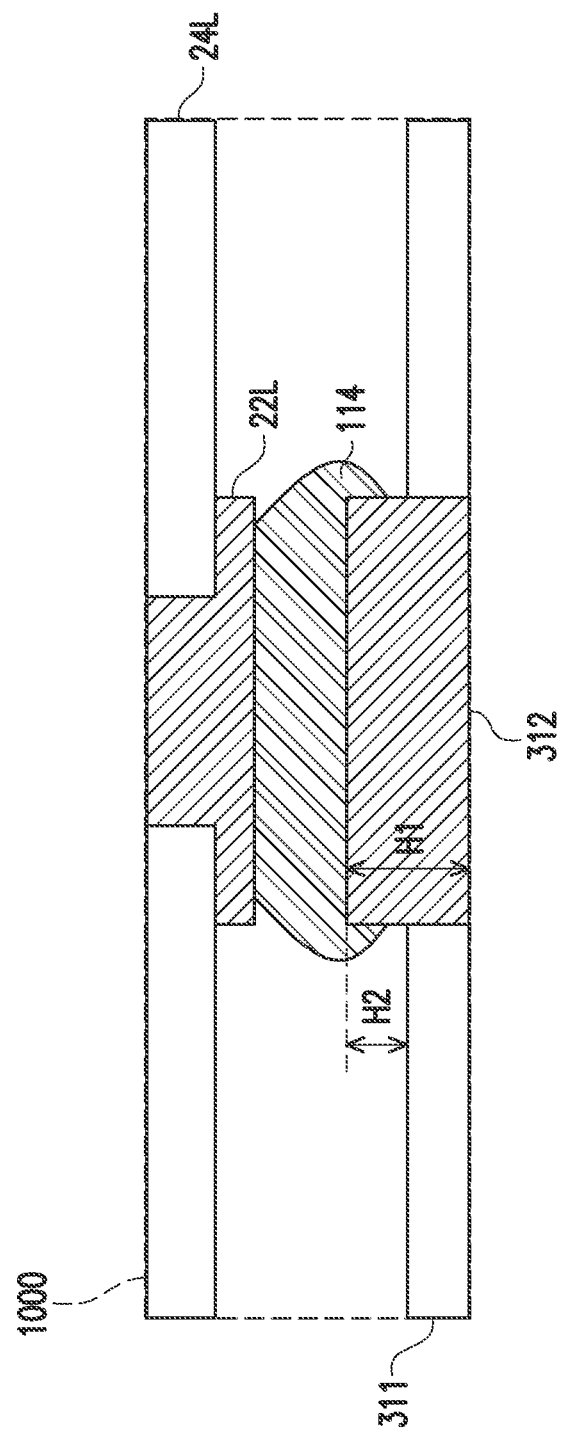

In FIGS. 7A and 7B, a HBM device 100 is attached to the wafer 302, e.g., to the interconnect structure 308 of the interposer 304. The HBM device 100 may be attached to the die connectors 312 of the wafer 302 by reflowing the conductive connectors 114 with a flip chip bonding process. In some embodiments, the reflowed conductive connectors 114 cover top surfaces and sidewalls of the die connectors 312 and physically contact the top surface of the dielectric layer 311. The recessing of the dielectric layer 311 (see above, FIGS. 6A and 6B) allows the conductive connectors 114 to cover a greater surface area of the die connectors 312, which may increase bonding strength. In some embodiments, as illustrated in accordance with FIG. 7C, respective portions of the lower sidewalls of the die connectors 312 are exposed between respective bottom surfaces of the conductive connectors 114 and the top surface of the dielectric layer 311.

Figure 8:
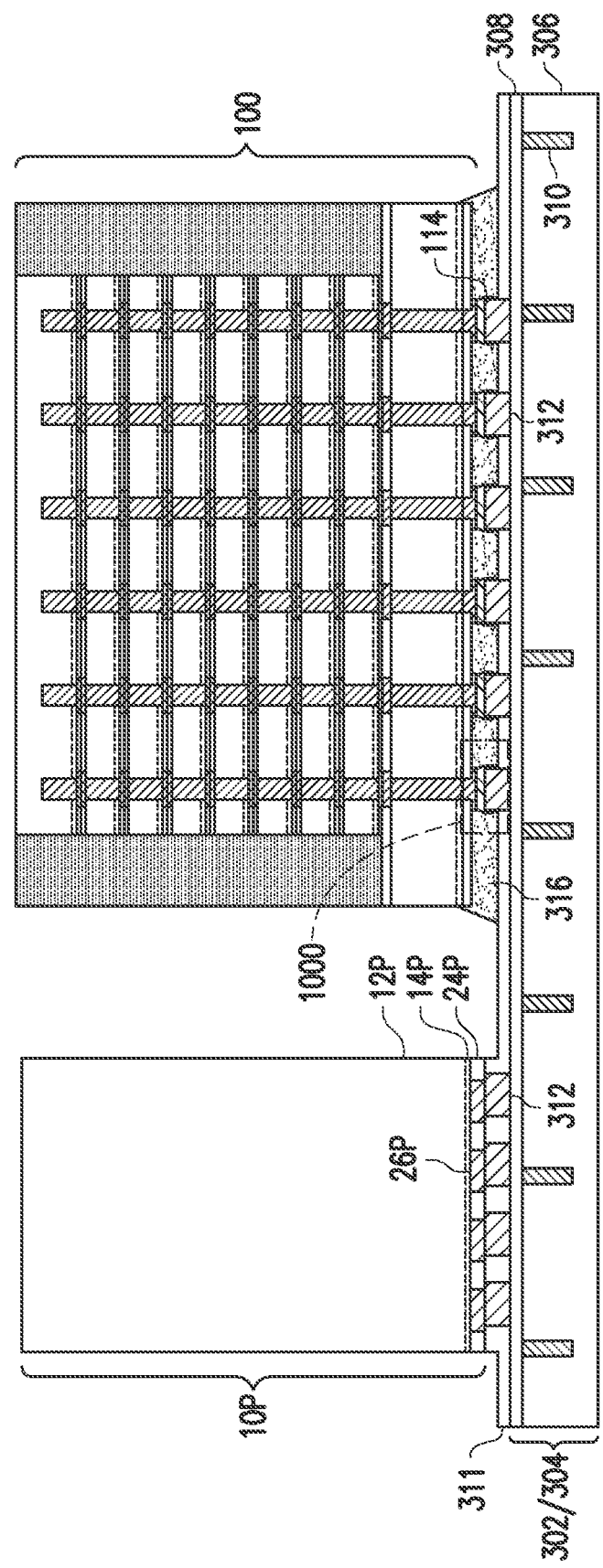

In FIG. 8, an underfill 316 may formed between the wafer 302 and the HBM device 100, surrounding the conductive connectors 114. The underfill 316 may reduce stress and protect the joints resulting from the reflowing of the reflowable conductive connectors 114. The recessing of the dielectric layer 311 (see above, FIGS. 6A and 6B) allows for a larger gap between the HBM device 100 and the interposer 304, which may improve the filling process for the underfill 316 and increase bonding strength. The underfill 316 may be formed by a capillary flow process after the HBM device 100 is attached, or may be formed by a suitable deposition method before the HBM device 100 is attached. The material of the underfill 316 may be a liquid epoxy, deformable gel, silicon rubber, the like, or a combination thereof. However, any suitable material may be used for the underfill 316.

Figure 9:
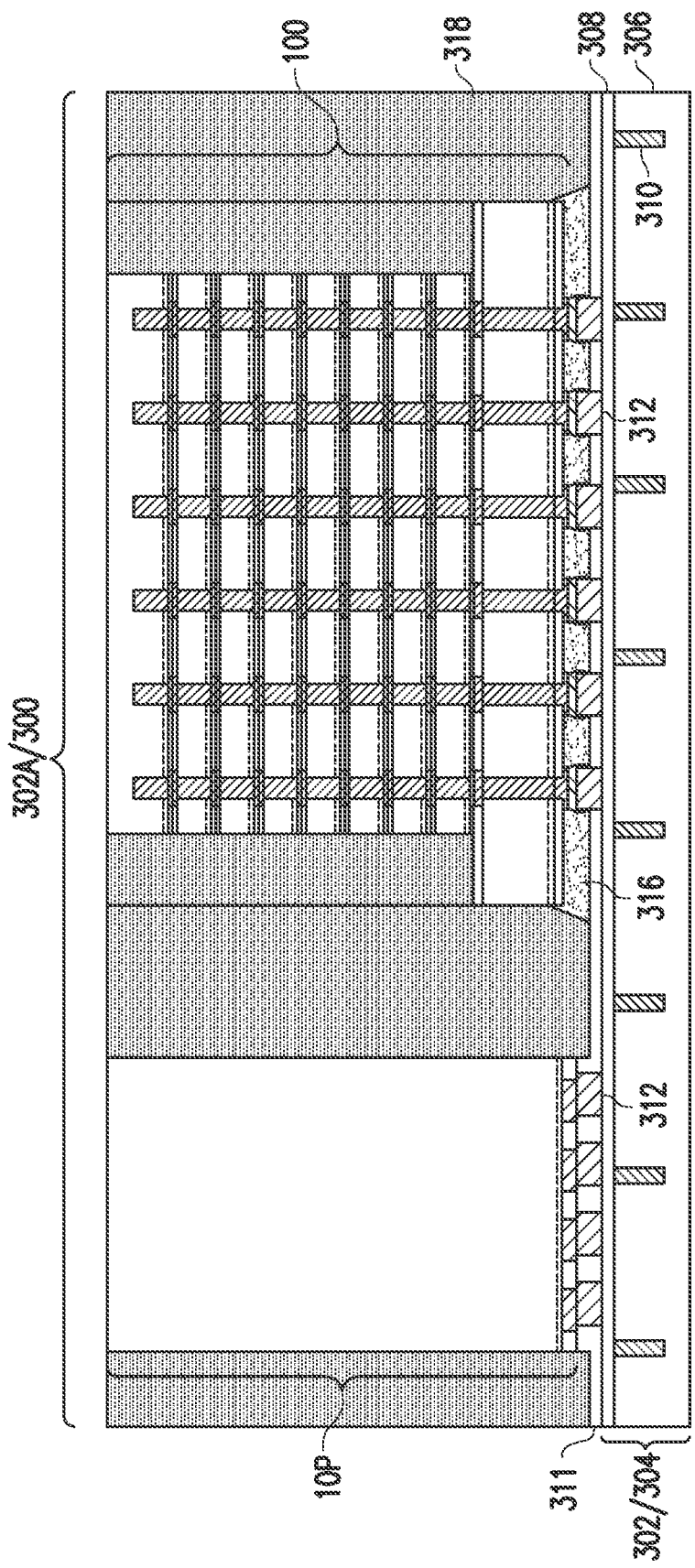

In FIG. 9, an encapsulant 318 is then formed on and around the various components. After formation, the encapsulant 318 encapsulates the HBM device 100 and the processor device 10P, and contacts the underfill 316. The encapsulant 318 may be formed of a similar material and by a similar method as the encapsulant 112 described with respect to FIG. 3D. A planarization process is optionally performed on the encapsulant 318 to expose the HBM device 100 and/or the processor device 10P. The structure is then flipped over and placed on a tape (not shown).

Figure 10:
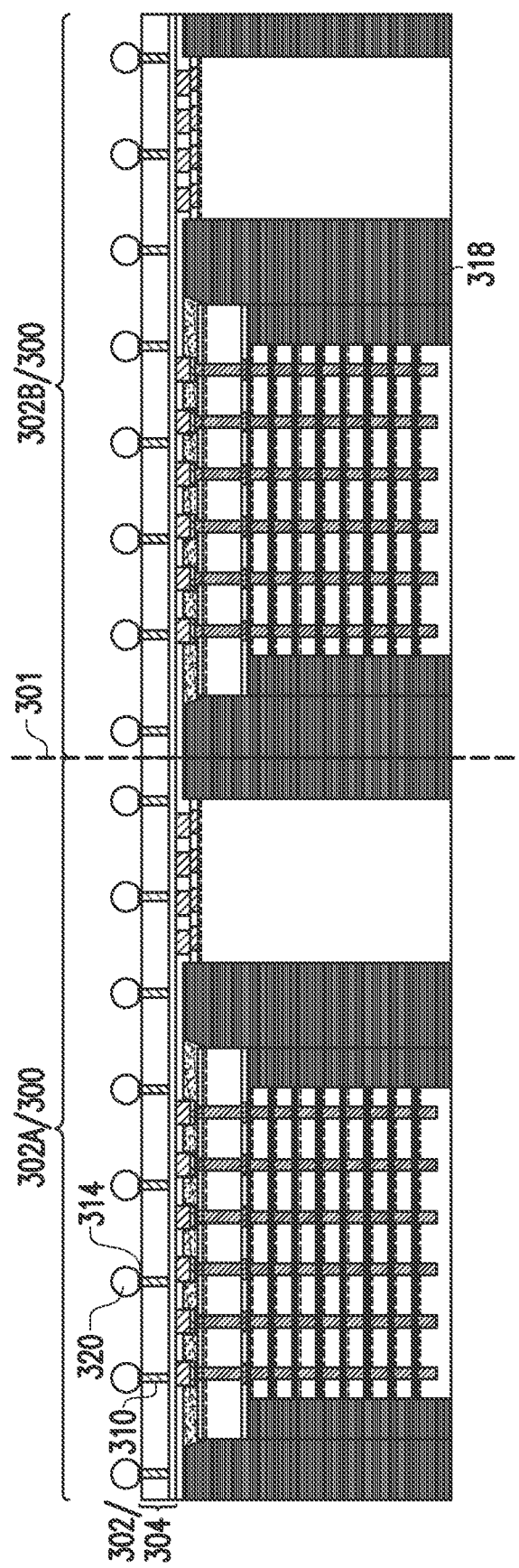

In FIG. 10, the wafer 302 is thinned. The thinning may be by a CMP process, a grinding process, an etch back process, the like, or combinations thereof, and is performed on the inactive surface of the wafer 302. The thinning exposes the conductive vias 310. After the thinning, surfaces of the conductive vias 310 and the inactive surface of the wafer 302 are coplanar (within process variations). As such, the conductive vias 310 are exposed at the back side of the interposer 304.

After exposing the conductive vias 310, external connectors 314 are formed on the inactive surface of the wafer 302 and are connected to the conductive vias 310. The external connectors 314 may be formed of a similar material and by a similar method as the die connectors 22L described with respect to FIG. 3A. Conductive connectors 320 are formed on the external connectors 314. The conductive connectors 320 may be formed of a similar material and by a similar method as the conductive connectors 114 described with respect to FIG. 3D.

Next, a singulation process is performed by sawing along scribe line regions 301, e.g., between the package region 302A and adjacent package regions such as e.g. package region 302B. The sawing singulates the package region 302A from adjacent package regions such as e.g. package region 302B. The resulting, singulated integrated circuit packages 300 are from the package region 302A and the package region 302B, respectively.

Figure 11A:
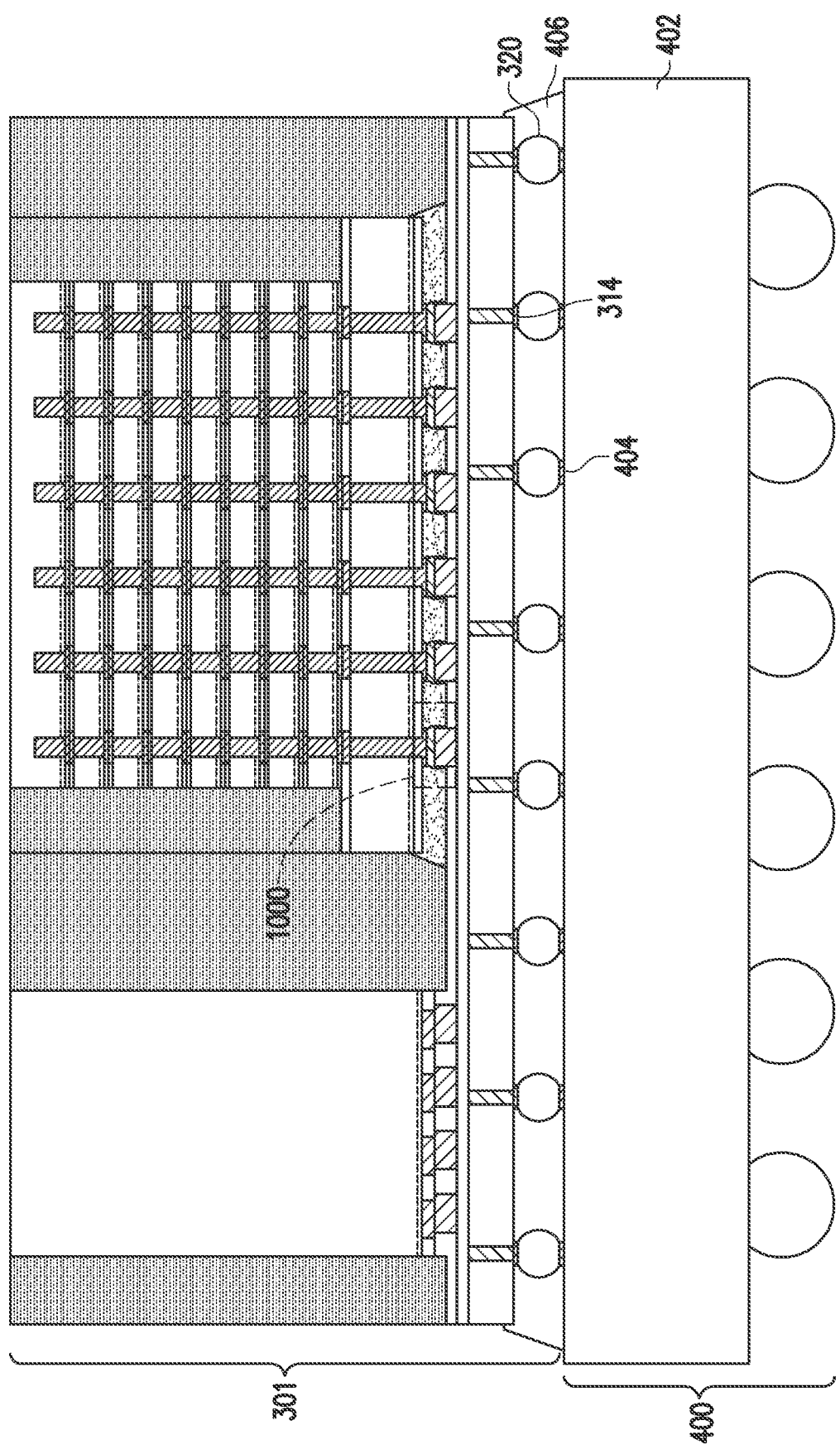

In FIG. 11A, the integrated circuit package 300, such as from the package region 302A (see above, FIG. 10) is mounted to a package substrate 400 using the conductive connectors 320. The package substrate 400 includes a substrate core 402 and bond pads 404 over the substrate core 402. The substrate core 402 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 402 may be a SOI substrate. Generally, an SOI substrate includes a layer of a semiconductor material such as epitaxial silicon, germanium, silicon germanium, SOI, SGOI, or combinations thereof. The substrate core 402 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 402.

The substrate core 402 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 402 may also include metallization layers and vias (not shown), with the bond pads 404 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 402 is substantially free of active and passive devices.

In some embodiments, the conductive connectors 320 are reflowed to attach the external connectors 314 to the bond pads 404. The conductive connectors 320 electrically and/or physically couple the package substrate 400, including metallization layers in the substrate core 402, to the integrated circuit package 300. In some embodiments, a solder resist is formed on the substrate core 402. The conductive connectors 320 may be disposed in openings in the solder resist to be electrically and mechanically coupled to the bond pads 404. The solder resist may be used to protect areas of the substrate core 402 from external damage.

In some embodiments, an underfill 406 may be formed between the integrated circuit package 300 and the package substrate 400 and surrounding the conductive connectors 320, to reduce stress and protect the joints resulting from the reflowing of the conductive connectors 320. The underfill 406 may be formed by a capillary flow process after the integrated circuit package 300 is attached or may be formed by a suitable deposition method before the integrated circuit package 300 is attached. The conductive connectors 320 may have an epoxy flux (not shown) formed thereon before they are reflowed with at least some of the epoxy portion of the epoxy flux remaining after the integrated circuit package 300 is attached to the package substrate 400. This remaining epoxy portion may act as the underfill 406.

In some embodiments, passive devices (e.g., surface mount devices (SMDs), not shown) may also be attached to the integrated circuit package 300 (e.g., to the external connectors 314) or to the package substrate 400 (e.g., to the bond pads 404). For example, the passive devices may be bonded to a same surface of the integrated circuit package 300 or the package substrate 400 as the conductive connectors 320. The passive devices may be attached to the integrated circuit package 300 prior to mounting the integrated circuit package 300 on the package substrate 400, or may be attached to the package substrate 400 before or after mounting the integrated circuit package 300 on the package substrate 400.

Figure 11B:
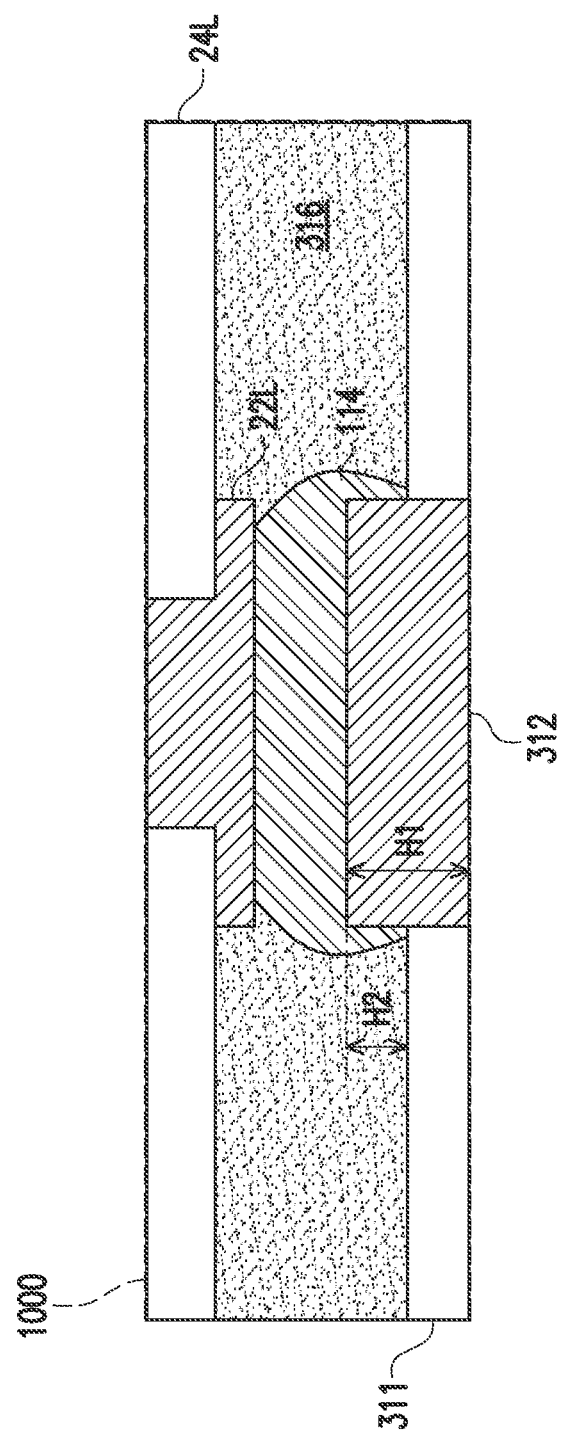
Figure 11C:
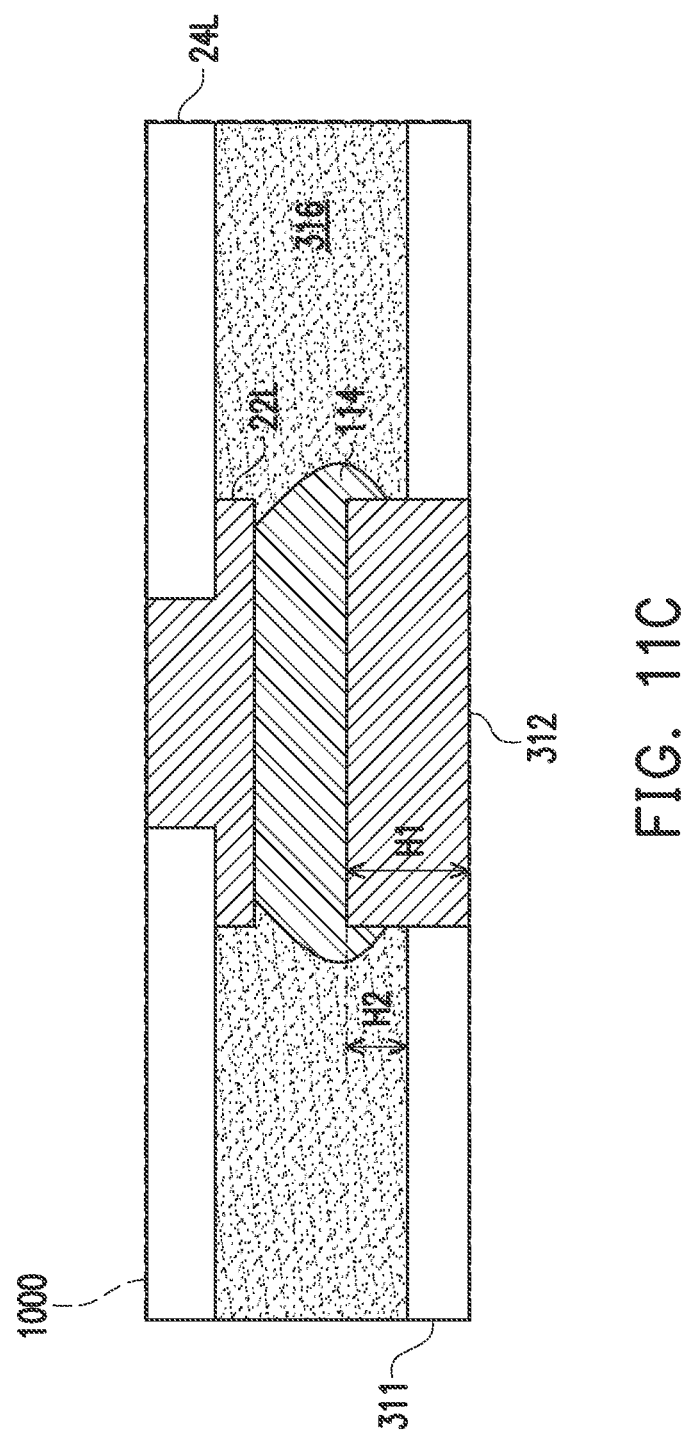

FIG. 11B illustrates a view of the region 1000 as illustrated in FIG. 11A, in accordance with some embodiments. The underfill 316 is disposed between the dielectric layer 24L and the dielectric layer 311. The conductive connector 114 is coupled to a bottom surface of the die connector 22L opposite of the dielectric layer 24L and covers a top surface and sidewalls of the die connector 312. The underfill 316 may cover sidewalls of the conductive connector 114 and sidewalls of the die connector 22L. In some embodiments, the underfill 316 covers a portion of the bottom surface of the die connector 22L. In some embodiments, as illustrated in accordance with FIG. 11C, respective portions of the lower sidewalls of the die connectors 312 are covered by the underfill 316.

FIGS. 12 through 14C are cross-sectional views of intermediate steps during a process for forming an integrated circuit package 350. In this embodiment, the integrated circuit package 350 is similar to the integrated circuit package 300 described above in reference to FIGS. 7A through 11A, where like reference numerals indicate like elements formed using like processes. Embodiments of the integrated circuit package 350 and the manufacturing thereof may differ from embodiments of the integrated circuit package 300 and the manufacturing thereof by, e.g., die connectors 312 used to mount a HBM device 100 on an interposer 304 being covered by a cap layer 324.

Figure 12:
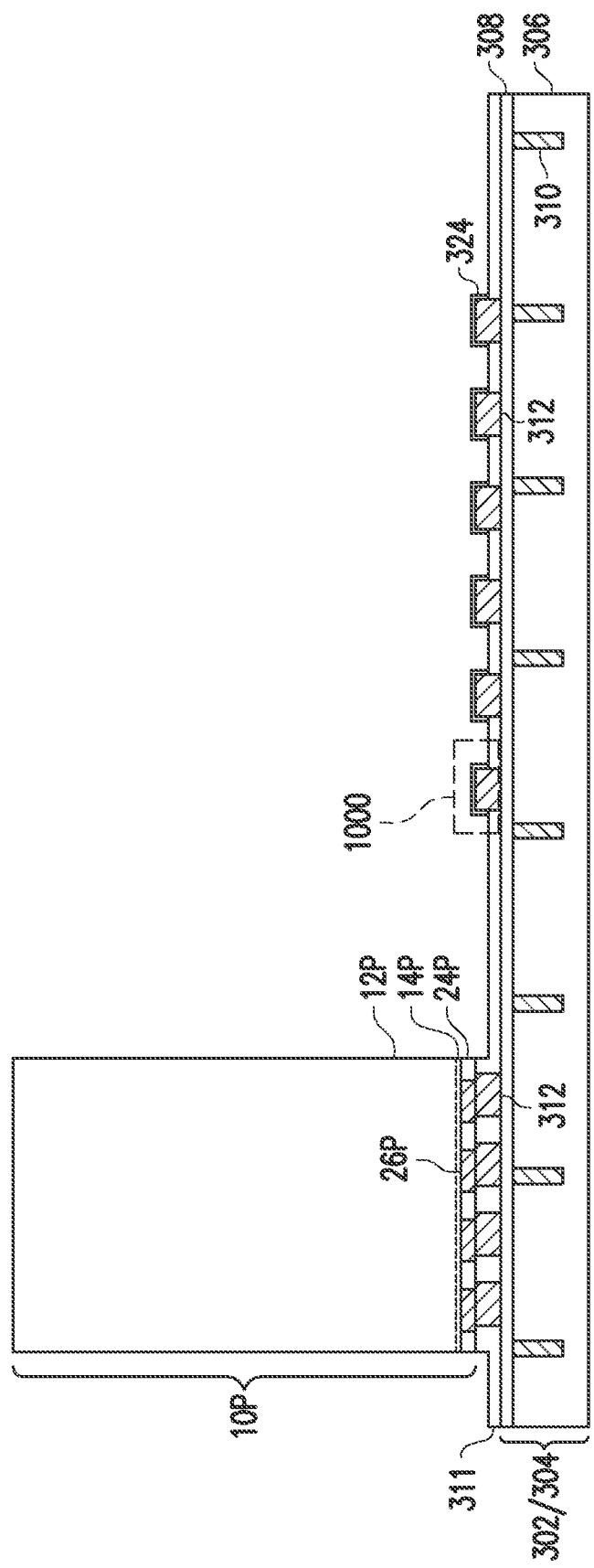
FIGS. 12 through 14C are cross-sectional views of intermediate steps during a process for forming integrated circuit packages, in accordance with some other embodiments.

FIG. 12 illustrates an embodiment, similar to the embodiment as shown above in FIG. 6A, in which a cap layer 324 is formed on exposed surfaces of the die connectors 312. The cap layer 324 may reduce the amount of intermetallic compound (IMC) formed in solder joints, such as e.g. the conductive connectors 114, between the interposer 304 and the subsequently attached HBM device 100 (see below, FIG. 13A), which may decrease resistance and improve device performance. The cap layer 324 may formed using an electroless (E-Less) plating process. The electroless plating process may comprise an electroless nickel/electroless palladium (ENEP) process, an electroless nickel/electroless palladium/immersion gold (ENEPIG) process, immersion gold process, or other processes, as examples. Other electroless processes may also be used to form the cap layer 324, for example.

Figure 13A:
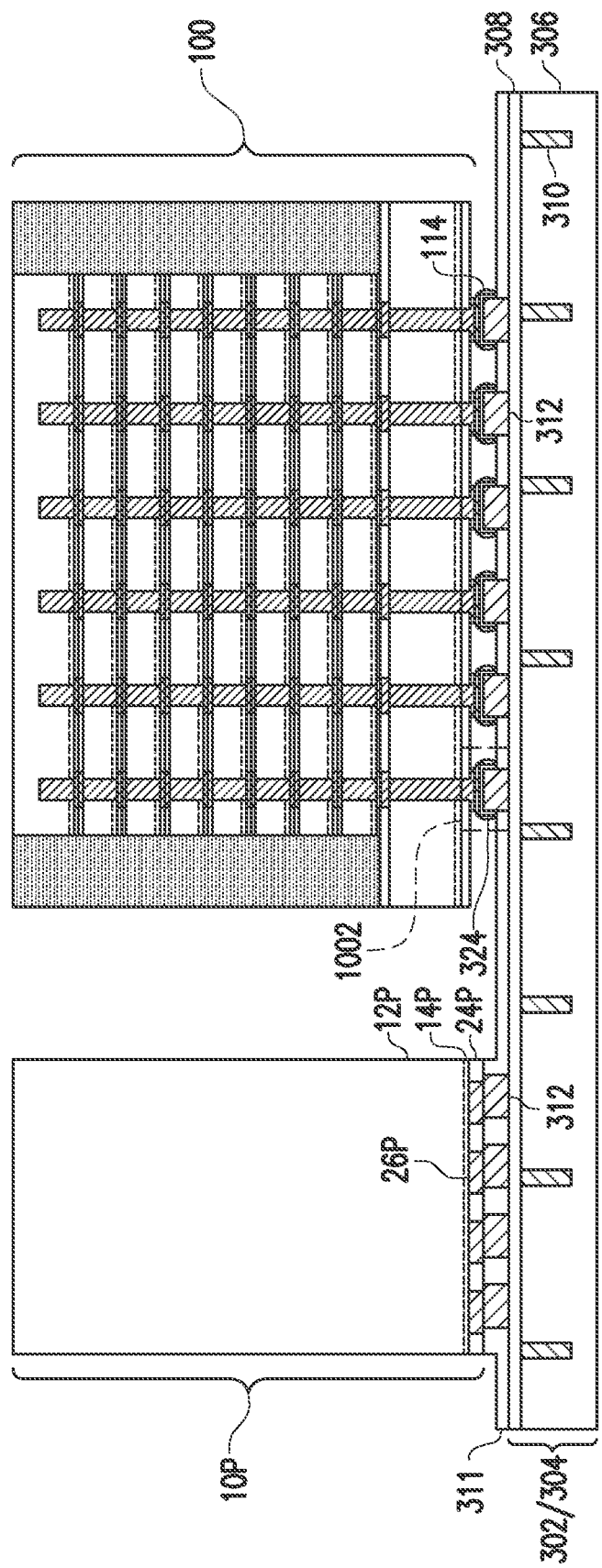
Figure 13B:
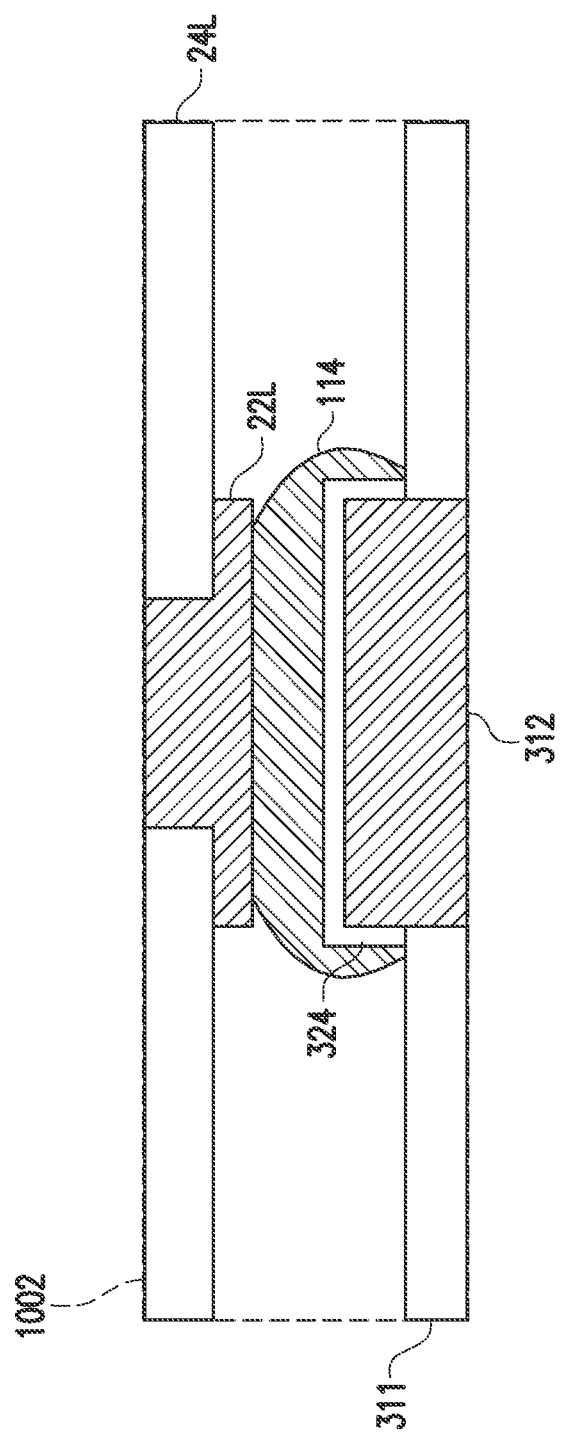
Figure 13C:
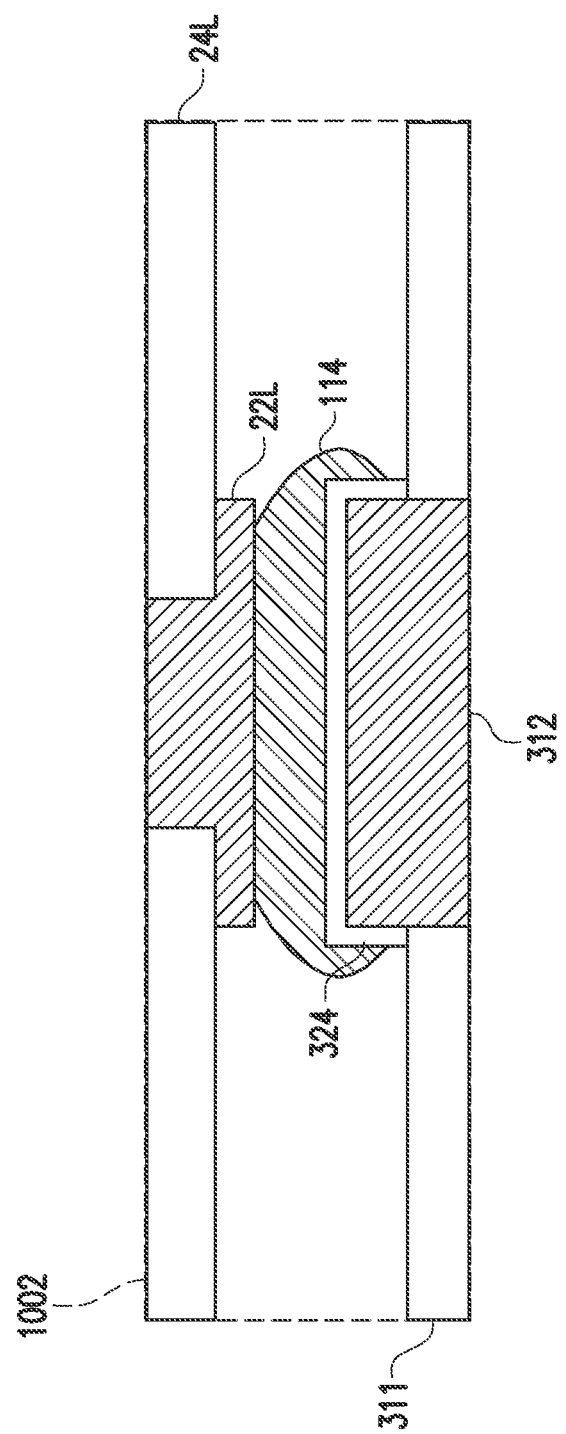

In FIG. 13A, a HBM device 100 is attached to the wafer 302, e.g., to the interconnect structure 308 of the interposer 304. FIG. 13B illustrates a view of region 1002 as illustrated in FIG. 13A, in accordance with some embodiments. The HBM device 100 may be attached to the die connectors 312 of the wafer 302 by reflowing the conductive connectors 114 with a flip chip bonding process. In some embodiments, the reflowed conductive connectors 114 cover the cap layer 324 on the top surfaces and sidewalls of the die connectors 312 and physically contact the top surface of the dielectric layer 311. In some embodiments, as illustrated in accordance with FIG. 13C, respective portions of the cap layer 324 are exposed between respective bottom surfaces of the conductive connectors 114 and the top surface of the dielectric layer 311.

Figure 14A:
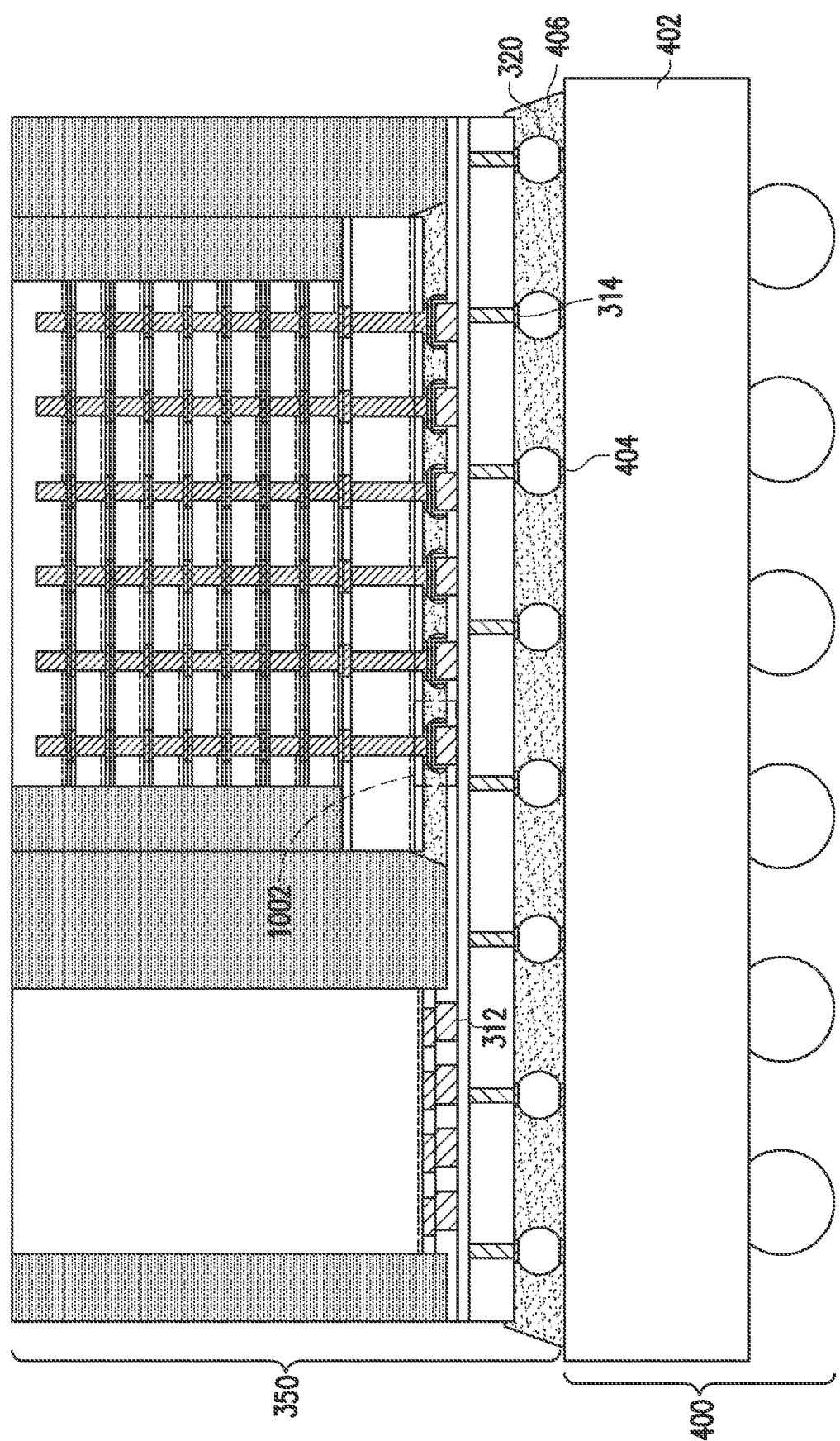
Figure 14B:
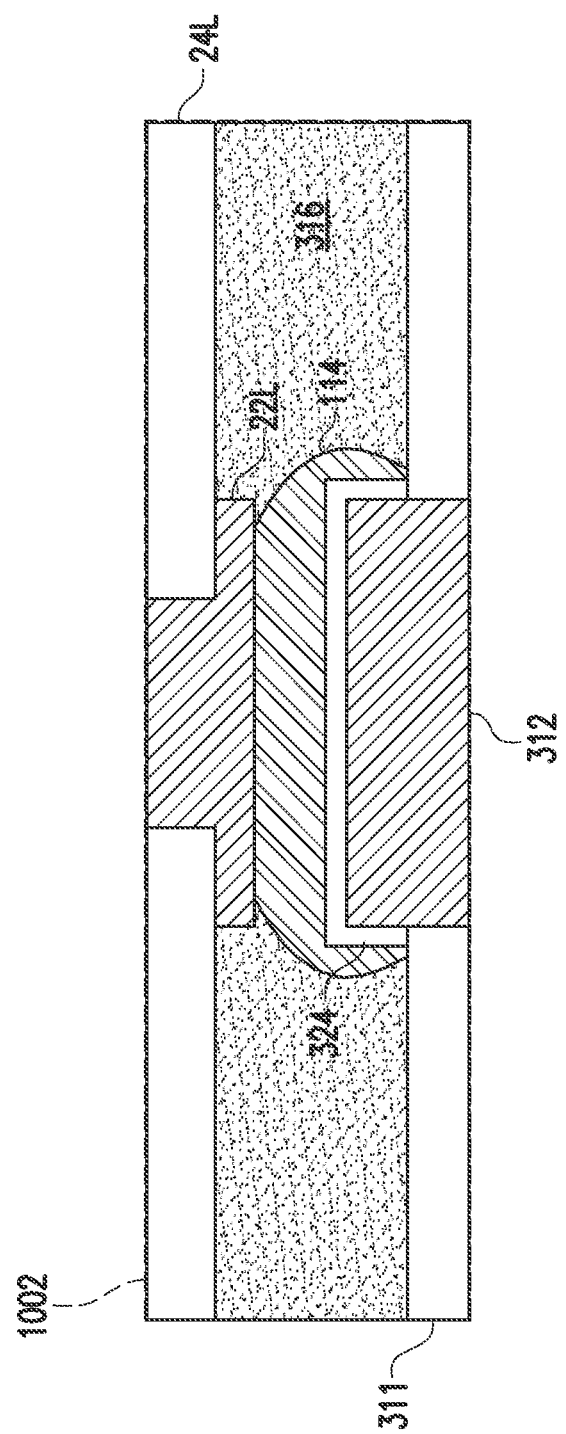
Figure 14C:
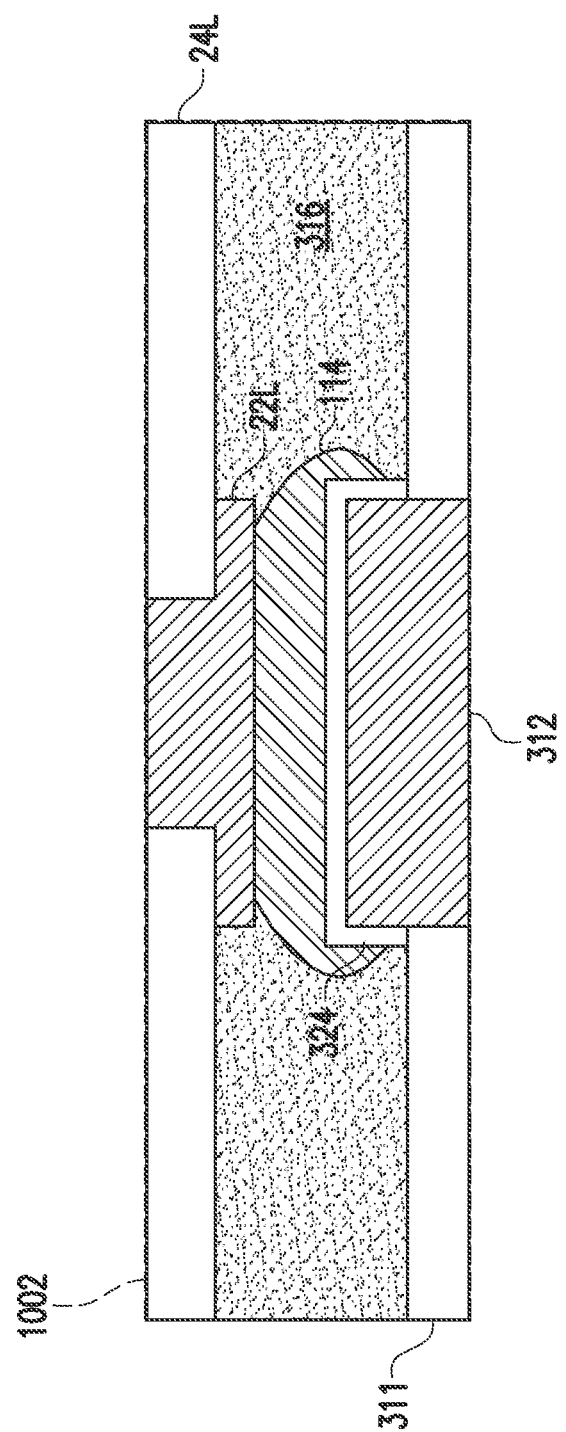

FIG. 14A illustrates an integrated circuit package 350 mounted on a package substrate 400 using conductive connectors 320. The integrated circuit package 350 may be formed from the structure illustrated in FIGS. 13A and 13B using similar methods as used to form the integrated circuit package 300 as described in respect to FIGS. 8 through 11A. FIG. 14B illustrates a view of the region 1002 as illustrated in FIG. 14A, in accordance with some embodiments. The underfill 316 is disposed between the dielectric layer 24L and the dielectric layer 311. The conductive connector 114 is coupled to a bottom surface of the die connector 22L opposite of the dielectric layer 24L and covers the cap layer 324. The underfill 316 may cover sidewalls of the conductive connector 114 and sidewalls of the die connector 22L. In some embodiments, the underfill 316 covers a portion of the bottom surface of the die connector 22L. In some embodiments, as illustrated in accordance with FIG. 14C, respective portions of the cap layer 324 between respective bottom surfaces of the conductive connectors 114 and the top surface of the dielectric layer 311 are covered by the underfill 316.

Embodiments may achieve advantages. A logic die is bonded to a dielectric layer on an interposer. A remaining exposed portion of the dielectric layer is then recessed, which exposes sidewalls of bonding pads extending from the interposer and provides a larger bonding area for a subsequently bonded memory device. The increasing surface area of the bonding pads increases bonding strength and enlarges a spacing between the memory device and the interposer. This may increase the reliability of the bonding by providing a larger process window for underfill filling between the memory device and the interposer. In some embodiments, a cap layer is formed on top surfaces and sidewalls of the bonding pads to reduce the amount of intermetallic compound (IMC) formed in solder joints between the memory device and the interposer.

In accordance with an embodiment, a method includes: attaching a logic die to a top side of an interposer, the interposer including a first die connector and a second die connector on the top side of the interposer and a first dielectric layer covering at least one sidewall of the first die connector and at least one sidewall of the second die connector, the logic die being coupled to the first die connector and to the first dielectric layer, the second die connector being exposed by the logic die; recessing the first dielectric layer, the recessing exposing at least one sidewall of the second die connector; and attaching a memory device to the top side of the interposer, the memory device being coupled to the second die connector. In an embodiment, the method further includes forming an underfill in a gap between the memory device and the interposer. In an embodiment, the method further includes forming a cap layer on a top surface and sidewalls of the second die connector. In an embodiment, forming the cap layer includes an electroless nickel/electroless palladium process. In an embodiment, the method further includes: encapsulating the memory device and the logic die with an encapsulant; and bonding the interposer to a package substrate, the interposer being located between the package substrate and the encapsulant. In an embodiment, the logic die includes a third die connector and a second dielectric layer, and wherein attaching the logic die to the top side of the interposer includes a metal-to-metal bond between the first die connector and a third die connector and a dielectric-to-dielectric bond between the first dielectric layer and the second dielectric layer. In an embodiment, attaching the memory device to the top side of the interposer includes flip-chip bonding.

In accordance with another embodiment, a method includes: placing a processor device on an interposer; forming a metal-to-metal bond between a first die connector of the processor device and a second die connector of the interposer and forming a dielectric-to-dielectric bond between a first dielectric layer of the processor device and a second dielectric layer of the interposer; exposing sidewalls of a third die connector by removing a top portion of the second dielectric layer exposed by the processor device; mounting a memory device on the interposer, the mounting the memory device including reflowing a first conductive connector on the third die connector to cover a top surface and exposed sidewalls of the third die connector; and forming an underfill between the memory device and the interposer. In an embodiment, the method further includes: encapsulating the processor device and the memory device with an encapsulant; forming a plurality of second conductive connectors on the interposer opposite the encapsulant; and singulating the processor device, the memory device, and a portion of the interposer to form an integrated circuit package. In an embodiment, the method further includes forming a cap layer on an exposed top surface and sidewalls of the third die connector, the cap layer including nickel or palladium. In an embodiment, the third die connector has a first height, removing the top portion of the second dielectric layer exposes a portion of the third die connector with a second height, and a ratio of the first height to the second height is in a range of 1 to 3. In an embodiment, the second height is in a range of 5 µm to 10 µm. In an embodiment the metal-to-metal bond is a Cu—Cu bond. In an embodiment, the metal-to-metal bond is a Ti—Ti bond or an Al—Al bond. In an embodiment, the metal-to-metal bond is a Cu—Ti bond, a Cu—Al bond, or a Ti—Al bond.

In accordance with yet another embodiment, an integrated circuit package includes: an interposer, the interposer including: a first dielectric layer; a first die connector, sidewalls of the first die connector being covered by the first dielectric layer; and a second die connector, a top portion of the second die connector extending above the first dielectric layer, a top surface of the second die connector being coplanar with a top surface of the first die connector; a logic device on the interposer, the logic device including a third die connector, the third die connector being bonded to the first die connector with a metal-to-metal bond; and a memory device on the interposer, the memory device being coupled to the interposer with a conductive connector, the conductive connector covering the top portion of the second die connector. In an embodiment, the integrated circuit package further includes a cap layer over the top portion of the second die connector, the conductive connector covering the cap layer. In an embodiment, the cap layer includes nickel or palladium. In an embodiment, the integrated circuit package further includes an underfill disposed between the interposer and the memory device. In an embodiment, the first dielectric layer includes: a first portion, the first portion being bonded to a second dielectric layer of the logic device; and a second portion, the second portion being below the first portion by a height in a range of 5 µm to 10 µm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   attaching a logic die to a top side of an interposer, the interposer comprising a first die connector and a second die connector on the top side of the interposer and a first dielectric layer covering at least one sidewall of the first die connector and at least one sidewall of the second die connector, the logic die being coupled to the first die connector and to the first dielectric layer, the second die connector being exposed by the logic die;
   recessing the first dielectric layer, the recessing exposing at least one sidewall of the second die connector; and
   attaching a memory device to the top side of the interposer, the memory device being coupled to the second die connector.

2. The method of claim 1, further comprising forming an underfill in a gap between the memory device and the interposer.

3. The method of claim 1, further comprising forming a cap layer on a top surface and sidewalls of the second die connector.

4. The method of claim 3, wherein forming the cap layer comprises an electroless nickel/electroless palladium process.

5. The method of claim 1, further comprising:
   encapsulating the memory device and the logic die with an encapsulant; and
   bonding the interposer to a package substrate, the interposer being located between the package substrate and the encapsulant.

6. The method of claim 1, wherein the logic die comprises a third die connector and a second dielectric layer, and wherein attaching the logic die to the top side of the interposer comprises a metal-to-metal bond between the first die connector and a third die connector and a dielectric-to-dielectric bond between the first dielectric layer and the second dielectric layer.

7. The method of claim 1, wherein attaching the memory device to the top side of the interposer comprises flip-chip bonding.

8. A method comprising:
   placing a processor device on an interposer;
   forming a metal-to-metal bond between a first die connector of the processor device and a second die connector of the interposer and forming a dielectric-to-dielectric bond between a first dielectric layer of the processor device and a second dielectric layer of the interposer;
   exposing sidewalls of a third die connector by removing a top portion of the second dielectric layer exposed by the processor device;

mounting a memory device on the interposer, the mounting the memory device comprising reflowing a first conductive connector on the third die connector to cover a top surface and exposed sidewalls of the third die connector; and forming an underfill between the memory device and the interposer.

9. The method of claim 8, further comprising:

encapsulating the processor device and the memory device with an encapsulant;

forming a plurality of second conductive connectors on the interposer opposite the encapsulant; and singulating the processor device, the memory device, and a portion of the interposer to form an integrated circuit package.

10. The method of claim 8, further comprising forming a cap layer on an exposed top surface and sidewalls of the third die connector, the cap layer comprising nickel or palladium.

11. The method of claim 8, wherein the third die connector has a first height, removing the top portion of the second dielectric layer exposes a portion of the third die connector with a second height, and a ratio of the first height to the second height is in a range of 1 to 3.

12. The method of claim 11, wherein the second height is in a range of 5 μm to 10 μm.

13. The method of claim 8, wherein the metal-to-metal bond is a Cu—Cu bond.

14. The method of claim 8, wherein the metal-to-metal bond is a Ti—Ti bond or an Al—Al bond.

15. The method of claim 8, wherein the metal-to-metal bond is a Cu—Ti bond, a Cu—Al bond, or a Ti—Al bond.

16. A method comprising:

placing a first die on a top side of an interposer;

forming a metal-to-metal bond and a dielectric-to-dielectric bond between the first die and the interposer;

after forming the dielectric-to-dielectric bond, exposing sidewalls of a die connector on a top side of the interposer; and mounting a second die on the interposer, the mounting the second die comprising reflowing a conductive connector of the second die to cover a top surface of the die connector.

17. The method of claim 16, wherein after reflowing the conductive connector further covers the exposed sidewalls of the die connector.

18. The method of claim 16, wherein exposing the sidewalls of the die connector comprises recessing a dielectric layer of the interposer.

19. The method of claim 16, further comprising forming a cap layer on the top surface and exposed sidewalls of the die connector.

20. The method of claim 19, wherein forming the cap layer comprises an electroless nickel process.

* * * * *